(12) United States Patent
Kim et al.

(10) Patent No.: US 12,437,721 B2
(45) Date of Patent: Oct. 7, 2025

(54) DISPLAY DEVICE

(71) Applicant: LG Display Co., Ltd., Seoul (KR)

(72) Inventors: Jaehyeong Kim, Paju-si (KR); JunHyeok Yang, Seoul (KR); Chanwoo Lee, Seoul (KR); Yeonjun Oh, Gimpo-si (KR)

(73) Assignee: LG Display Co., Ltd (KR)

( * ) Notice: Subject to any disclaimer, the term of this patent is extended or adjusted under 35 U.S.C. 154(b) by 83 days.

(21) Appl. No.: 18/371,307

(22) Filed: Sep. 21, 2023

(65) Prior Publication Data

US 2024/0169927 A1 May 23, 2024

(30) Foreign Application Priority Data

Nov. 22, 2022 (KR) .................. 10-2022-0157390

(51) Int. Cl.
*G09G 3/3266* (2016.01)
*H10K 59/121* (2023.01)
*H10K 59/126* (2023.01)
*H10K 59/80* (2023.01)
*H10K 77/10* (2023.01)
*H10K 102/00* (2023.01)

(52) U.S. Cl.
CPC ....... *G09G 3/3266* (2013.01); *H10K 59/1213* (2023.02); *H10K 59/1216* (2023.02); *H10K 59/126* (2023.02); *H10K 59/874* (2023.02); *H10K 77/111* (2023.02); *G09G 2380/02* (2013.01); *H10K 2102/311* (2023.02)

(58) Field of Classification Search
CPC ............. G09G 3/3266; G09G 2380/02; G09G 3/3208; H10K 59/1213; H10K 59/1216; H10K 59/126; H10K 59/874; H10K 77/111; H10K 2102/311; H10K 59/12; H10K 59/121; H10K 59/124; H10K 59/131
See application file for complete search history.

(56) References Cited

U.S. PATENT DOCUMENTS

2017/0032733 A1\* 2/2017 Jang .................. G09G 3/20

FOREIGN PATENT DOCUMENTS

| KR | 10-2019-0043799 A | 4/2019 |
| KR | 10-2021-0074627 A | 6/2021 |
| KR | 10-2023-0034700 A | 3/2023 |

\* cited by examiner

*Primary Examiner* — Jonathan A Boyd
(74) *Attorney, Agent, or Firm* — Fish & Richardson P.C.

(57) ABSTRACT

A display device includes a substrate which includes an active area and a non-active area and is formed of any one of transparent conducting oxide and an oxide semiconductor layer; a gate driver which is disposed in the non-active area on the substrate and includes a Q node; and a Q node shielding layer disposed between the substrate and the Q node.

10 Claims, 19 Drawing Sheets

100

DISPLAY DEVICE

CROSS-REFERENCE TO RELATED APPLICATION

This application claims the priority of Korean Patent Application No. 10-2022-0157390 filed on Nov. 22, 2022, which is hereby incorporated by reference in its entirety.

BACKGROUND

Field of the Disclosure

The present disclosure relates to a display device, and more particularly, to a display device which does not use a plastic substrate to improve a moisture permeation characteristic and minimize a parasitic capacitance in a gate driver.

Description of the Background

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material to be capable of displaying images even though the display device is folded or rolled is getting attention as a next generation display device.

SUMMARY

The inventors have recognized that the plastic substrate is formed by coating and curing a substrate material at a high temperature so that there are problems in that it takes a long time and it is difficult to form the thickness to be lower than a predetermined level. Accordingly, the present disclosure is directed to a display device that substantially obviates one or more of problems due to limitations and disadvantages described above.

More specifically, the present disclosure is to provide a display device which uses one of a transparent conducting oxide layer and an oxide semiconductor layer as a substrate, instead of a plastic substrate.

In addition, the present disclosure is to provide a display device which may minimize a parasitic capacitance between a substrate and a Q node of a gate driver.

Further, the present disclosure is to provide a display device which may stably maintain a potential of a Q node.

The present disclosure is not limited to the above-mentioned and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate which includes an active area and a non-active area and is formed of any one of transparent conducting oxide and an oxide semiconductor layer; a gate driver which is disposed in the non-active area on the substrate and includes a Q node; and a Q node shielding layer disposed between the substrate and the Q node.

In another aspect of the present disclosure, a display device includes a substrate which includes an active area including a plurality of sub pixels disposed therein and a non-active area and is formed of any one of transparent conducting oxide and an oxide semiconductor layer; a gate driver which is disposed in the non-active area on the substrate to be connected to the plurality of sub pixels and includes a Q node; and a Q node shielding layer disposed to overlap with the Q node between the substrate and the Q node.

Other detailed matters of the exemplary aspects are included in the detailed description and the drawings.

According to the present disclosure, a transparent conductive oxide layer and an oxide semiconductor layer are used as a substrate of the display device to easily control a moisture permeability and improve a flexibility.

According to the present disclosure, a Q node shielding layer is disposed between the substrate and the Q node to minimize a parasitic capacitance generated between the substrate and the Q node.

According to the present disclosure, a bootstrap potential of the Q node is improved to stably maintain a potential of the Q node.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
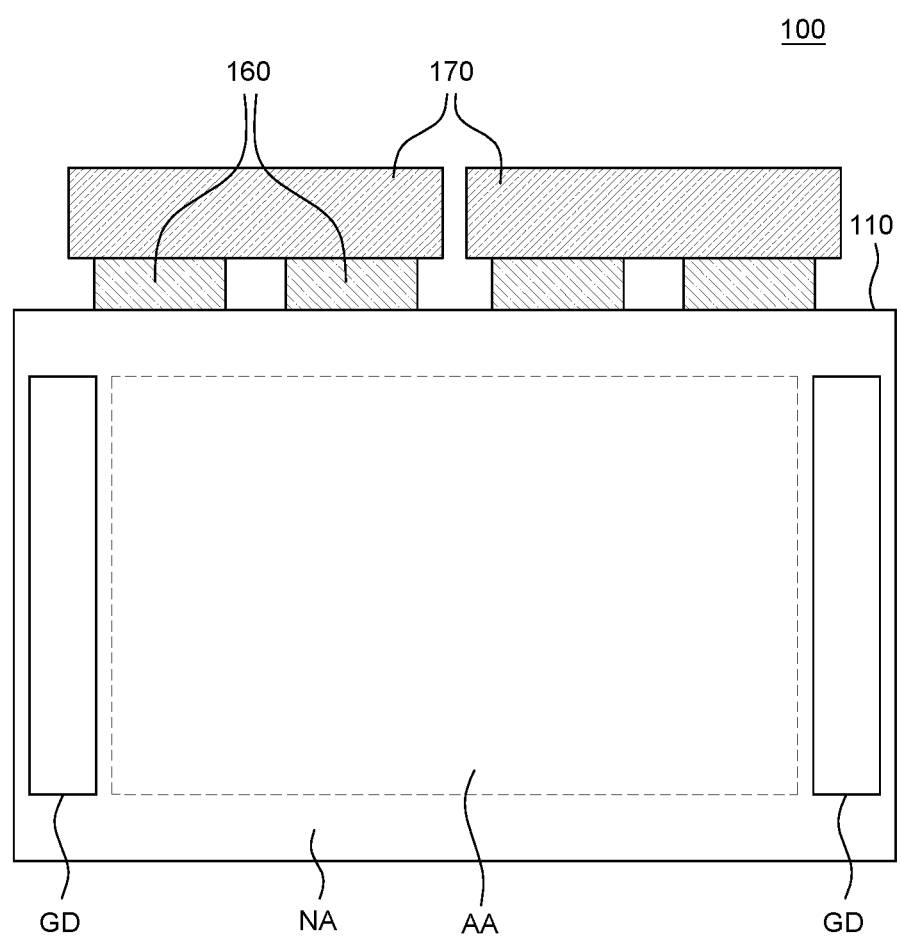
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', 'consist of' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure. Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, various aspects of the present disclosure will be described in detail with reference to accompanying drawings.

Figure 2:
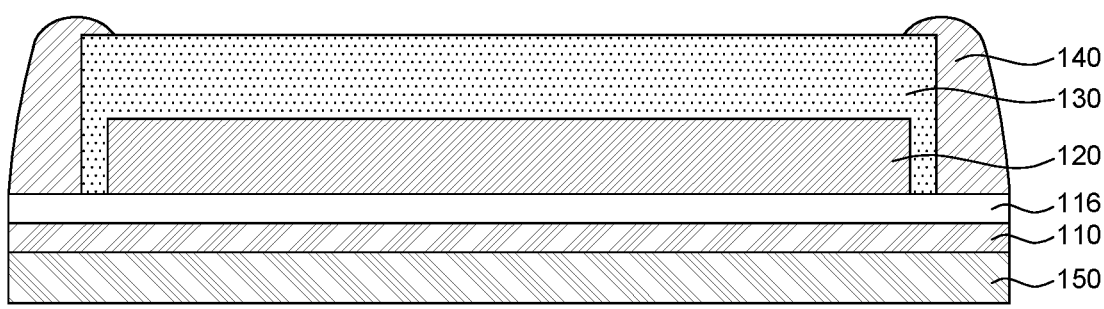
FIG. 2 is a schematic cross-sectional view of a display device according to an exemplary aspect of the present disclosure.

FIG. 1 is a plan view of a display device according to an exemplary aspect of the present disclosure. FIG. 2 is a schematic cross-sectional view of a display device according to an exemplary aspect of the present disclosure. For the convenience of description, in FIG. 1, among various components of the display device 100, only a substrate 110, a plurality of flexible films 160, and a plurality of printed circuit boards 170 are illustrated.

Referring to FIGS. 1 and 2, the substrate 110 is a support member which supports other components of the display device 100. The substrate 110 may be formed of any one of a transparent conducting oxide and an oxide semiconductor. For example, the substrate 110 may be formed of a transparent conducting oxide (TCO), such as indium tin oxide (ITO), indium zinc oxide (IZO), or indium tin zinc oxide (ITZO).

Further, the substrate 110 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the substrate 110 may be formed by another transparent conducting oxide and oxide semiconductor material which have not been described in the specification, but is not limited thereto.

In the meantime, the substrate 110 may be formed by depositing the transparent conducting oxide or an oxide semiconductor with a very thin thickness. Therefore, as the substrate 110 is formed to have a very thin thickness, the substrate may have a flexibility. A display device including a substrate 110 having a flexibility may be implemented as a flexible display device 100 which may display an image even in a folded or rolled state. For example, when the display device 100 is a foldable display device, the substrate 110 may be folded or unfolded with respect to a folding axis. As another example, when the display device 100 is a rollable display device, the display device may be stored by being rolled around the roller. Accordingly, the display device 100 according to the exemplary aspect of the present disclosure uses a substrate 110 having a flexibility to be implemented as a flexible display device 100 like a foldable display device or a rollable display device.

Further, the display device 100 according to the exemplary aspect of the present disclosure uses a substrate 110 formed of a transparent conducting oxide or an oxide semiconductor to perform a laser lift off (LLO) process. The LLO process refers to a process of separating a temporary substrate below the substrate 110 and the substrate 110 using laser during the manufacturing process of a display device 100. Accordingly, the substrate 110 is a layer for more easily performing the LLO process so that it may also be referred to as a functional thin film, a functional thin film layer, or a functional substrate. The LLO process will be described in more detail below.

The substrate 110 includes an active area AA and a non-active area NA disposed in the vicinity of the active area AA or surrounding the active area AA.

The active area AA is an area where images are displayed. In the active area AA, a pixel unit 120 configured by a plurality of sub pixels may be disposed to display images. For example, the pixel unit 120 is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs such as a gate driver IC and a data driver IC may be disposed.

The non-active area NA includes a gate driving area. The gate driving area is an area where a gate driver GD is disposed. The gate driver GD outputs a gate voltage and an emission control voltage in accordance with the control of the timing controller to select a sub pixel SP to which the data voltage is charged and control an emission timing. For example, as illustrated in FIG. 1, the gate driving area in which the gate driver GD is formed may be a non-active area NA at a left side and a right side of the active area AA, but is not limited thereto, for example, the gate driving area may be disposed at a left side or a right side of the active area AA. In this case, the gate driving area in which the gate driver GD is disposed may also be referred to as a gate-driver in panel (GIP) area.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels of the active area AA. One ends of the plurality of flexible films 160 are disposed in the non-active area NA of the substrate 110 to supply a data voltage to the plurality of sub pixels of the active area AA, and another ends of the plurality of flexible films 160 are connected with a printed circuit board 170. In the meantime, even though it is illustrated that the plurality of flexible films 160 is four in FIG. 1, the number of flexible films 160 may vary depending on the design, and is not limited thereto, for example, the number of flexible films 160 is n (where n is integer).

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), a chip on panel (COP), a tape automated bonding (TAB), a tape carrier package (TCP) or a gate in panel (GIP) technique depending on a mounting method.

For example, the data driver IC may be mounted on the plurality of flexible films 160 through a chip on films (COF) process, may be connected to the substrate 110 through a tape automated bonding (TAB) or a tape carrier package (TCP) process, may be directly adhered to a non-active area of the substrate 110 through a chip on glass (COG) or a chip on panel (COP) process, but is not limited thereto.

For example, the gate driver IC is disposed in a non-active area on both sides or one side of the active area AA of the substrate 110 through a gate in panel (GIP) process. However, the process for forming the gate driver IC is not limited thereto, for example, the gate driver IC may be disposed on both sides or one side of the substrate 110 through a COF process, a TAB process, a TCP process, a COG process or a COP process.

In the present specification, for the convenience of description, it is described that the driving IC is mounted on the plurality of flexible films 160 by a chip on film (COF) manner, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto, for example, the number of printed circuit boards 170 is n (where n is integer).

Referring to FIG. 2, a lower buffer layer 116 is disposed on the substrate 110. The lower buffer layer 116 may suppress moisture and/or oxygen which penetrate from the outside of the substrate 110 from being spread. The moisture permeation characteristic of the display device 100 may be controlled by controlling a thickness or a lamination structure of the lower buffer layer 116. Further, the lower buffer layer 116 may suppress a short problem caused when the substrate 110 formed of a transparent conducting oxide or an oxide semiconductor is in contact with the other configurations such as a pixel unit 120. The lower buffer layer 116 may be formed of an inorganic material, for example, may be configured by a single layer or a plurality of layers of silicon oxide (SiOx) or silicon nitride (SiNx), but is not limited thereto.

The pixel unit 120 is disposed on the lower buffer layer 116. The pixel unit 120 may be disposed to correspond to the active area AA. The pixel unit 120 is a component which includes a plurality of sub pixels to display images. The plurality of sub pixels of the pixel unit 120 is minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer, but is not limited thereto. The driving circuit for driving the plurality of sub pixels may include a driving element such as a thin film transistor or a storage capacitor, but is not limited thereto.

The thin-film transistor TFT may include any semiconductor layer of various types of semiconductor layers. For example, the semiconductor layer may be formed of one selected from among oxide semiconductor material, amorphous semiconductor material, or polycrystalline semiconductor material, but the present disclosure is not limited thereto.

The oxide semiconductor material may have an excellent effect of preventing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polysilicon, but is not limited thereto.

The amorphous semiconductor material may be made of amorphous silicon (Si), but is not limited thereto.

Hereinafter, for the convenience of description, it is assumed that the light emitting diode of each of the plurality of sub pixels is an organic light emitting diode, but it is not limited thereto. For example, light emitting diode of each of the plurality of sub pixels may be inorganic LED, such as micro-LED.

In the meantime, the display device 100 may be configured by a top emission type, a bottom emission type or dual-side emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the organic light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

According to the dual-side emission type, light emitted from the light emitting diode is emitted to an upper portion and a lower portion of the substrate 110 on which the light emitting diode is disposed. In the case of the dual-side emission type, the anode and the cathode may both be formed of a transparent conductive material to allow the light emitted from the light emitting diode to travel to the upper portion and the lower portion of the substrate 110.

Hereinafter, for the convenience of description, the description will be made by assuming that the display device 100 according to an exemplary aspect of the present disclosure is a bottom emission type display device, but it is not limited thereto.

An encapsulation layer 130 is disposed to cover the pixel unit 120. The encapsulation layer 130 seals the pixel unit 120 to protect the light emitting diode of the pixel unit 120 from moisture, oxygen, and impacts of the outside. The encapsulation layer 130 may be configured by thin film encapsulation (TFE) formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of an organic material such as acrylic resin, epoxy resin, phenolic resin, polyamide resin, and polyimide resin, but they are not limited thereto.

For example, encapsulation layer 130 may include a first inorganic encapsulation layer, a second organic encapsulation layer, and a third inorganic encapsulation layer sequentially stacked.

The first inorganic encapsulation layer and the third inorganic encapsulation layer may be made of an inorganic material such as silicon nitride (SiNx), silicon oxide (SiOx), and aluminum oxide (AlOx). The second organic encapsulation layer may be made of an organic material such as acrylic resin, epoxy resin, phenolic resin, polyamide resin, and polyimide resin. Materials of the first inorganic encapsulation layer, the second organic encapsulation layer and the third inorganic encapsulation layer are not limited thereto.

Meanwhile, the encapsulation layer 130 is not limited to three layers, for example, the encapsulation layer 130 may include n layers alternately stacked between inorganic encapsulation layer and organic encapsulation layer (where n is an integer greater than 3).

Further, the encapsulation layer 130 may also be configured by a face seal type. For example, the encapsulation layer 130 may be formed by forming ultraviolet or thermosetting sealant on the entire surface of the pixel unit 120. However, the structure of the encapsulation layer 130 may be formed by various methods and materials, but is not limited thereto.

In the meantime, an encapsulation substrate which has a high modulus and is formed of a metal material having a strong corrosion resistance may be further disposed on the encapsulation layer 130. For example, the encapsulation substrate may be formed of a material having a high modulus of approximately 200 to 900 MPa, for example approximately 400 to 700 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel, but not limited thereto. Therefore, as the encapsulation substrate is formed of a metal material, the encapsulation substrate may be implemented as an ultra-thin film and provide a strong resistance against external impacts and scratches.

A seal member 140 is disposed to enclose side surfaces of the pixel unit 120 and the encapsulation layer 130. The seal member 140 is disposed in the non-active area NA and may be disposed to enclose the pixel unit 120 disposed in the active area AA. The seal member 140 is disposed to enclose a side surface of the pixel unit 120 and a side surface of the encapsulation layer 130 to minimize the moisture permeation to the pixel unit 120. For example, the seal member 140 may be disposed to cover an upper surface of the lower buffer layer 116 overlapping with a non-active area NA protruding to the outside of the pixel unit 120, a side surface of the encapsulation layer 130 disposed to enclose the pixel unit 120, and a part of an upper surface of the encapsulation layer 130.

The seal member 140 may be formed of a non-conducting material having an elasticity to encapsulate the side surface of the pixel unit 120 and reinforce the rigidity of the side surface of the display device 100. Further, the seal member 140 may also be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly urethane, epoxy, or acryl-based material, but is not limited thereto.

A polarizer 150 is disposed below the substrate 110. The polarizer 150 selectively transmits light to reduce the reflection of external light which is incident onto the substrate 110. Specifically, in the display device 100, various metal materials which are applied to semiconductor devices, wiring lines, and light emitting diodes is formed on the substrate 110. Therefore, the external light incident onto the substrate 110 may be reflected from the metal material so that the visibility of the display device 100 may be reduced due to the reflection of the external light. At this time, the polarizer 150 which suppresses the reflection of external light is disposed below the substrate 110 to increase outdoor visibility of the display device 100. However, the polarizer 150 may also be omitted depending on an implementation example of the display device 100.

Even though not illustrated in the drawing, a barrier film may be disposed below the substrate 110 together with the polarizer 150. The barrier film minimizes the permeation of the moisture and oxygen outside the substrate 110 into the substrate 110 to protect the pixel unit 120 including a light emitting diode. However, the barrier film may also be omitted depending on an implementation example of the display device 100, but it is not limited thereto.

Hereinafter, the plurality of sub pixels of the pixel unit 120 will be described in more detail with reference to FIGS. 3 to 5.

Figure 3:
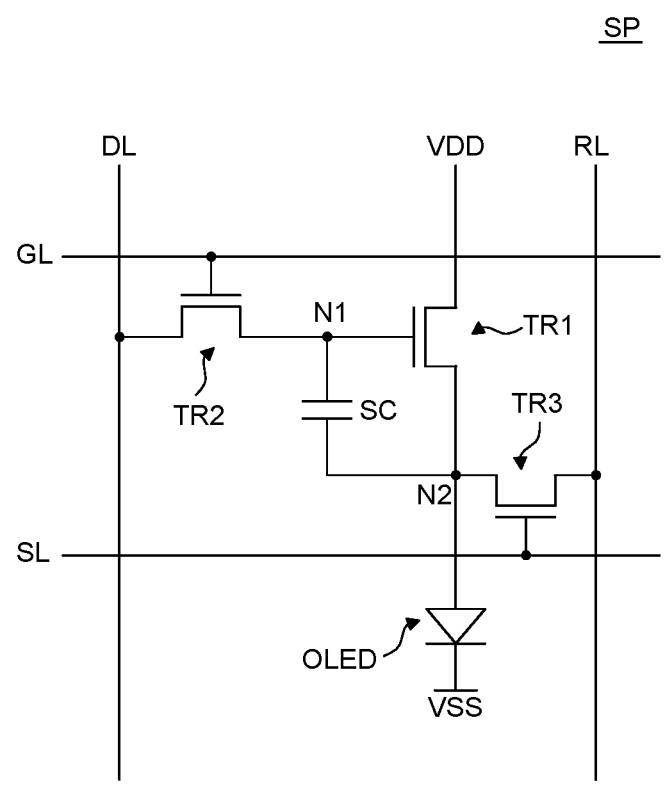
FIG. 3 is a circuit diagram of a sub pixel of a display device according to an exemplary aspect of the present disclosure.

FIG. 3 is a circuit diagram of a sub pixel of a display device according to an exemplary aspect of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. To drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current may flow from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 may be turned off. When the first transistor TR1 is turned on, a driving current may be transmitted to the light emitting diode OLED by means of the first transistor TR1. Therefore, the first transistor TR1 which controls the driving current transmitted to the light emitting diode OLED may also be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may also be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of the plurality of capacitor electrodes is connected to the first node N1 and another one may be connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary aspect of the present disclosure has a 3T1C structure including three transistors and one storage capacitor SC. However, the number and a connection relationship of the transistors and the storage capacitor may vary in various ways depending on the design and are not limited thereto.

For example, a number of transistors in the driving circuit of each sub-pixel SP of the present disclosure may be three or more, and a number of storage capacitor may be one or more, for example, the driving circuit of each sub-pixel of the present disclosure also may be a 3T2C driving circuit including three transistors and two storage capacitors, a 4T1C driving circuit including four transistors and one storage capacitor, a 4T2C driving circuit including four transistors and two storage capacitors, a 5T1C driving circuit including five transistors and one storage capacitor, a 5T2C driving circuit including five transistors and two storage capacitors, a 7T2C driving circuit including seven transistors and two storage capacitors, or the like.

Meanwhile, respective subpixels of the plurality of subpixels may have the same structure, or some subpixels of the plurality of subpixels may have a different structure. Each of the driving transistors and switching transistors may be an N-type transistor or a P-type transistor. In the case of an N-type transistor, the gate-on voltage may be a gate-high voltage, and the gate-off voltage may be a gate-low voltage. In the case of a P-type transistor, the gate-on voltage may be the gate-low voltage and the gate-off voltage may be the gate-high voltage.

Figure 4:
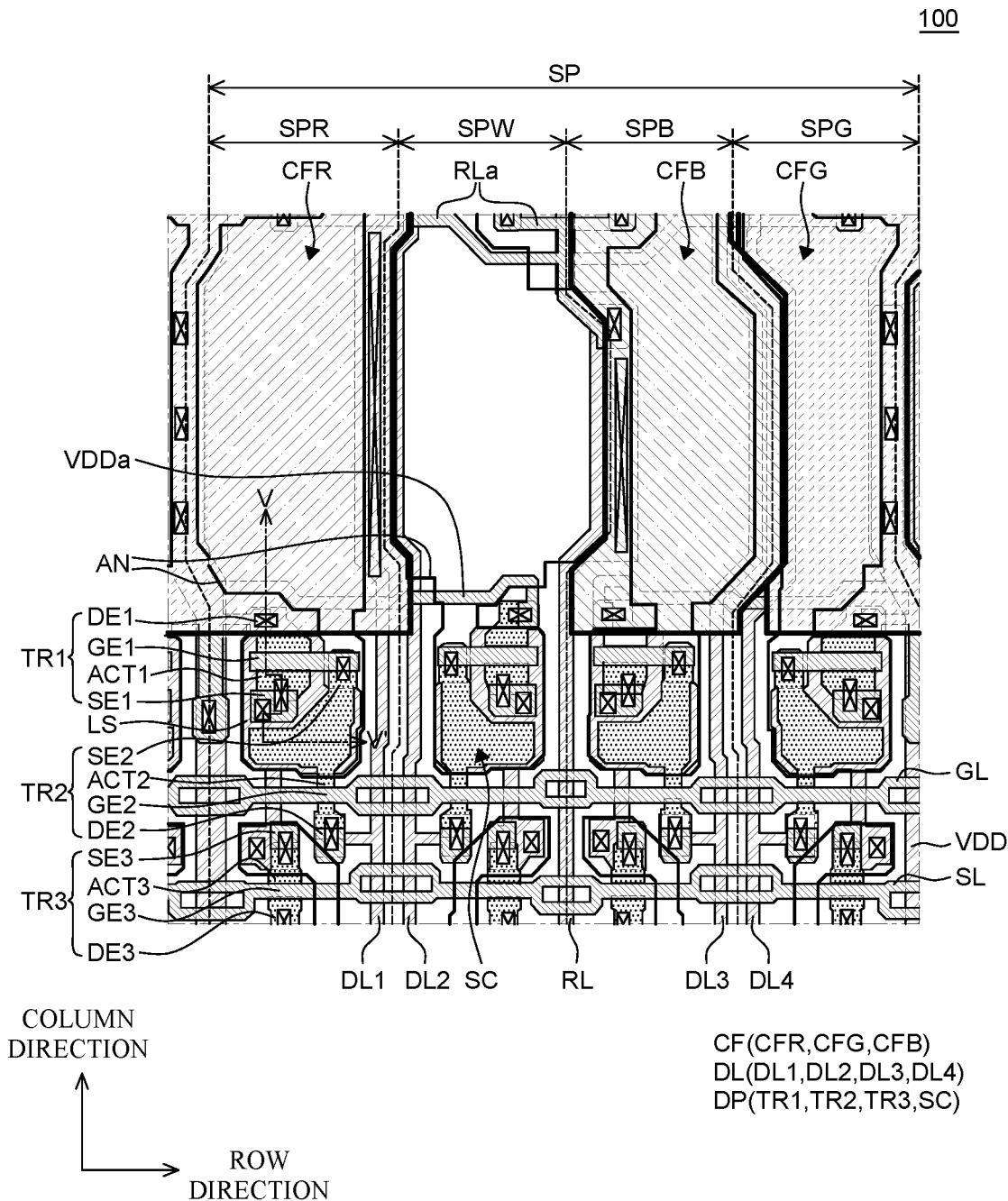
FIG. 4 is an enlarged plan view of a display device according to an exemplary aspect of the present disclosure.

FIG. 4 is an enlarged plan view of a display device according to an exemplary aspect of the present disclosure. FIG. 5 is a cross-sectional view taken along line V-V' of FIG. 4. FIG. 4 is an enlarged plan view of a red sub pixel SPR, a white sub pixel SPW, a blue sub pixel SPB, and a green sub pixel SPG which configure one pixel. In FIG. 4, for the convenience of description, the bank 115 is omitted and edges of the plurality of color filters CF are illustrated with a bold solid line. Referring to FIGS. 4 and 5, the display device 100 according to the exemplary aspect of the present disclosure includes a substrate 110, a lower buffer layer 116, an upper buffer layer 111, a gate insulating layer 112, a passivation layer 113, a planarization layer 114, a bank 115, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the colors and placement order of the plurality of sub pixels SP is not limited thereto. For example, the plurality of sub pixels SP includes a red sub pixel SPR, a green sub pixel SPG, and a blue sub pixel SPB. For example, the red sub pixel SPR, the blue sub pixel SPB, and the green sub pixel SPG may be sequentially disposed along a row direction. in addition, the occupied areas of the red sub pixel SPR, the white sub pixel SPW, the blue sub pixel SPB, and the green sub pixel SPG may be different from each other.

Each of the plurality of sub pixels SP includes an emission area and a circuit area. The emission area is an area where one color light is independently emitted and the light emitting diode OLED may be disposed therein. Specifically, in an area where the plurality of color filters CF and the anode AN overlap with each other, an area which is exposed from the bank 115 to allow light emitted from the light emitting diode OLED to travel to the outside may be defined as an emission area. For example, referring to FIGS. 4 and 5 together, an emission area of the red sub pixel SPR may be an area exposed from the bank 115 in an area in which the red color filter CFR and the anode AN overlap with each other. An emission area of the green sub pixel SPG may be an area exposed from the bank 115 in an area in which the green color filter CFG and the anode AN overlap with each other. An emission area of the blue sub pixel SPB may be an area exposed from the bank 115 in an area in which the blue color filter CFB and the anode AN overlap with each other. At this time, in an emission area of the white sub pixel SPW in which a separate color filter CF is not disposed, an area overlapping with a part of the anode AN exposed from the bank 115 may be a white emission area which emits white light.

The circuit area is an area excluding the emission area and a driving circuit DP for driving the plurality of light emitting diodes OLED and a plurality of wiring lines which transmits various signals to the driving circuit DP may be disposed. The circuit area in which the driving circuit DP, the plurality of wiring lines, and the bank 115 are disposed may be a non-emission area. For example, in the circuit area, the driving circuit DP including the first transistor TR1, the second transistor TR2, the third transistor TR3, and the storage capacitor SC, a plurality of high potential power lines VDD, a plurality of data lines DL, a plurality of reference lines RL, a plurality of gate lines GL, a sensing line SL, and the bank 115 may be disposed.

Figure 5:
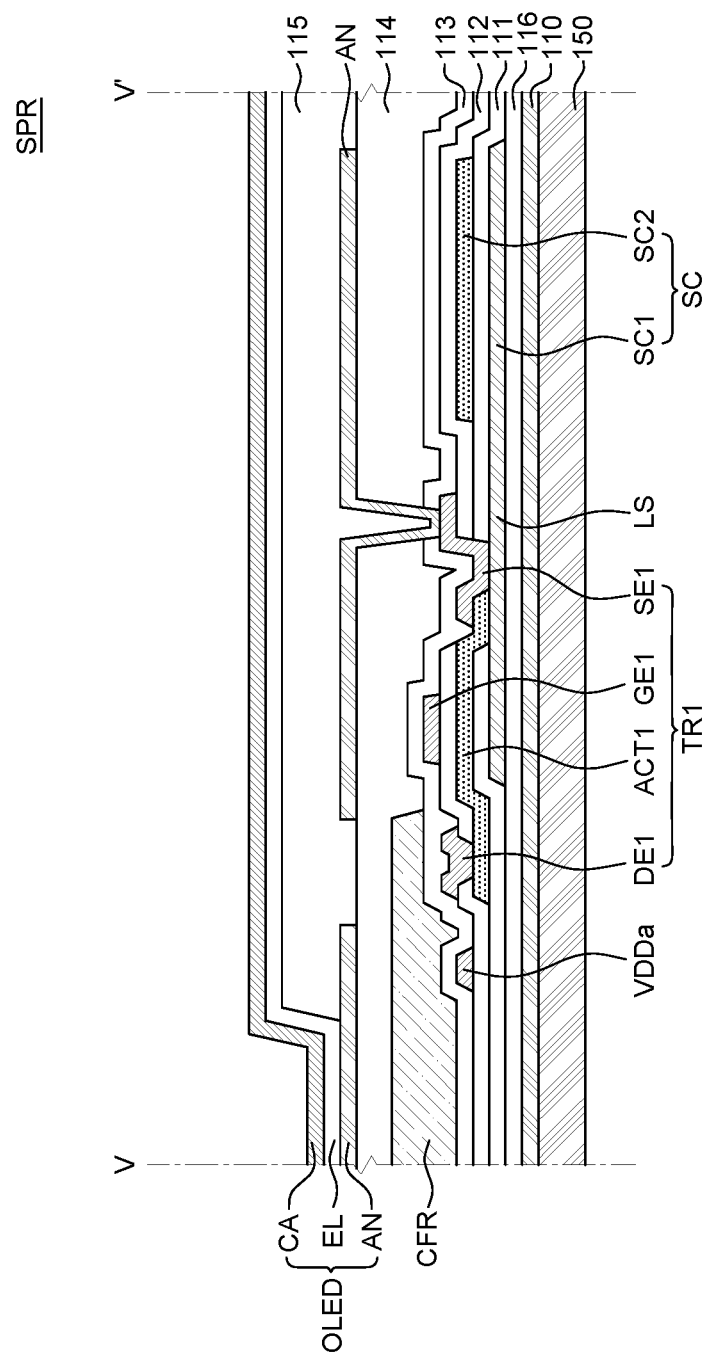
FIG. 5 is a cross-sectional view taken along line V-V' of FIG. 4.

Referring to FIGS. 3 to 5, the lower buffer layer 116 is disposed on the substrate 110 and the plurality of high potential power lines VDD, the plurality of data lines DL, the plurality of reference lines RL, and the light shielding layer LS are disposed on the lower buffer layer 116.

The plurality of high potential power lines VDD, the plurality of data lines DL, the plurality of reference lines RL, and the light shielding layer LS are disposed on the same layer of the substrate 110 and may be formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), and chrome (Cr), or an alloy thereof, but are not limited thereto.

The plurality of high potential power lines VDD is wiring lines which transmit the high potential power signal to each of the plurality of sub pixels SP. The plurality of high potential power lines VDD may extend between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL, this shared design is resource-efficient, minimizing redundancy and promoting uniformity in pixel behavior. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG. By directing the reference voltage through a single line to multiple sub-pixels, the system simplifies the overall layout.

Referring to FIGS. 4 and 5 together, a light shielding layer LS is disposed on the lower buffer layer 116. The light shielding layer LS is disposed to overlap with the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material, such as copper (Cu), aluminum (Al), molybdenum (Mo), nickel (Ni), titanium (Ti), and chrome (Cr), or an alloy thereof, is disposed to overlap with the first active layer ACT1, light incident from the lower portion of the substrate 110 onto the first active layer ACT may be blocked. Accordingly, the reliability of the first transistor TR1 may be improved. However, it is not limited thereto and the light shielding layer LS may also be disposed to overlap with the second active layer ACT2 of the second transistor TR2 and the third active layer ACT3 of the third transistor TR3.

In the meantime, even though in the drawing, it is illustrated that the light shielding layer LS is a single layer, the light shielding layer LS may be formed as a plurality of layers. For example, the light shielding layer LS may be formed of a plurality of layers disposed to overlap with each other with at least one of the lower buffer layer 116, the upper buffer layer 111, the gate insulating layer 112, and the passivation layer 113 therebetween.

The lower buffer layer 116 may be formed on the substrate 110. The lower buffer layer 116 is to prevent moisture from permeating from the outside, and may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. Further, the lower buffer layer 116 may also be omitted depending on a type of substrate 110 or a type of transistor, but is not limited thereto.

The upper buffer layer 111 is disposed on the plurality of high potential power lines VDD, the plurality of data lines DL, the plurality of reference lines RL, and the light shielding layer LS. The upper buffer layer 111 may reduce permeation of moisture or impurities through the substrate 110. For example, the upper buffer layer 111 may be configured by a single layer or a plurality of layers of silicon oxide (SiOx) or silicon nitride (SiNx), but is not limited thereto. Further, the upper buffer layer 111 may also be omitted depending on a type of substrate 110 or a type of transistor, but is not limited thereto.

In each of the plurality of sub pixels SP, the first transistor TR1, the second transistor TR2, the third transistor TR3, and the storage capacitor SC are disposed on the upper buffer layer 111.

First, the first transistor TR1 includes a first active layer ACT1, a first gate electrode GE1, a first source electrode SE1, and a first drain electrode DE1.

The first active layer ACT1 is disposed on the upper buffer layer 111. The first active layer ACT1 may be formed of a semiconductor material such as an oxide semiconductor, amorphous silicon, or polysilicon, for example, the oxide semiconductor material may be formed of any one of indium gallium zinc oxide (IGZO), indium zinc oxide (IZO), indium gallium tin oxide (IGTO), and indium gallium oxide (IGO), but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a plurality of layers of silicon oxide (SiOx) or silicon nitride (SiNx), but is not limited thereto. In addition, the gate insulating layer 112 may be formed by atomic layer deposition (ALD) method or metal organic chemical vapor deposition (MOCVD).

The first gate electrode GE1 is disposed on the gate insulating layer 112 to overlap with the first active layer ACT1. The first gate electrode GE1 may be configured by a conductive material, such as copper (Cu), aluminum (Al), molybdenum (Mo), nickel (Ni), titanium (Ti), and chrome (Cr), or an alloy thereof, but is not limited thereto. In this example, first gate electrode GE1 adopts a top gate method, however, the present disclosure is not limited thereto. For example, the first TFT GT may be a bottom gate type or a dual gate type.

A first source electrode SE1 and a first drain electrode DE1 which are spaced apart from each other are disposed on the gate insulating layer 112. The first source electrode SE1 and the first drain electrode DE1 may be electrically connected to the first active layer ACTT through a contact hole formed on the gate insulating layer 112. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but are not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. In essence, this auxiliary high potential power line VDDa acts as a supplementary route, ensuring a stable and continuous flow of high potential power. The provision of such auxiliary paths can enhance the reliability of the system by providing alternate pathways in case of any disruption or inefficiencies in the high potential power lines VDD. One end of the auxiliary high potential power line VDDa is electrically connected to the high potential power line VDD and the other end may be electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the upper buffer layer 111. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may also be electrically connected by another method, but it is not limited thereto.

The first source electrode SE1 may be electrically connected to the light shielding layer LS through a contact hole formed on the gate insulating layer 112 and the upper buffer layer 111. Further, a part of the first active layer ACT1 connected to the first source electrode SE1 may be electrically connected to the light shielding layer LS through a contact hole formed on and the upper buffer layer 111. If the light shielding layer LS is floated, a threshold voltage of the first transistor TR1 fluctuates to affect the driving of the display device 100. Accordingly, the light shielding layer LS is electrically connected to the first source electrode SE1 to apply a voltage to the light shielding layer LS and it may not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 may also be in direct contact with the light shielding layer LS. However, it is not limited thereto.

In the meantime, even though in FIG. 5, it is illustrated that the gate insulating layer 112 is formed on the entire substrate 110, the gate insulating layer 112 may be patterned to overlap with only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the upper buffer layer 111. The second active layer ACT2 may be formed of a semiconductor material such as an oxide semiconductor, amorphous silicon, or polysilicon, for example, the oxide semiconductor material may be formed of any one of indium gallium zinc oxide (IGZO), indium zinc oxide (IZO), indium gallium tin oxide (IGTO), and indium gallium oxide (IGO), but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the upper buffer layer 111. The second source electrode SE2 may be integrally formed with the second active layer ACT2 to be electrically connected to each other. For example, the semiconductor material is formed on the upper buffer layer 111 and a part of the semiconductor material is conducted to form the second source electrode SE2. Therefore, a part of the semiconductor material which is not conducted may become a second active layer ACT2 and a conducted part may serve as a second source electrode SE2. However, the second active layer ACT2 and the second source electrode SE2 may be separately formed, but are not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 112. Accordingly, the first transistor TR1 may be turned on or turned off by a signal from the second transistor TR2.

The gate insulating layer 112 is disposed on the second active layer ACT2 and the second source electrode SE2 and the second drain electrode DE2 and the second gate electrode GE2 are disposed on the gate insulating layer 112.

The second gate electrode GE2 is disposed on the gate insulating layer 112 to overlap with the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material, such as copper (Cu), aluminum (Al), molybdenum (Mo), nickel (Ni), titanium (Ti), and chrome (Cr), or an alloy thereof, but is not limited thereto.

In the meantime, the second gate electrode GE2 may extend from the gate line GL.

That is, the second gate electrode GE2 may be integrally formed with the gate line GL and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 is electrically connected to the second active layer ACT2 through a contact hole formed in the gate insulating layer 112 and may be electrically connected to one of the plurality of data lines DL through a contact hole formed in the gate insulating layer 112 and the upper buffer layer 111, simultaneously. For example, the second drain electrode DE2 of the red sub pixel SPR is electrically connected to the first data line DL1 and the second drain electrode DE2 of the white sub pixel SPW may be electrically connected to the second data line DL2. For example, the second drain electrode DE2 of the blue sub pixel SPB is electrically connected to the third data line DL3 and the second drain electrode DE2 of the green sub pixel SPG may be electrically connected to the fourth data line DL4. The second drain electrode DE2 may be configured by a conductive material, such as copper (Cu), aluminum (Al), molybdenum (Mo), nickel (Ni), titanium (Ti), and chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the upper buffer layer 111. The third active layer ACT3 may be formed of a semiconductor material, such as an oxide semiconductor, amorphous silicon, or polysilicon, for example, the oxide semiconductor material may be formed of any one of indium gallium zinc oxide (IGZO), indium zinc oxide (IZO), indium gallium tin oxide (IGTO), and indium gallium oxide (IGO), but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 112 is disposed on the third active layer ACT3 and the third gate electrode GE3, the third source electrode SE3, and the third drain electrode DE3 are disposed on the gate insulating layer 112.

The third gate electrode GE3 is disposed on the gate insulating layer 112 to overlap with the third active layer ACT3. The third gate electrode GE3 may be electrically connected to the sensing line SL and the third transistor TR3 may be turned on or turned off based on the sensing voltage transmitted to the third transistor TR3. The third gate electrode GE3 may be configured by a conductive material, such as copper (Cu), aluminum (Al), molybdenum (Mo), nickel (Ni), titanium (Ti), and chrome (Cr), or an alloy thereof, but is not limited thereto.

In the meantime, the third gate electrode GE3 may extend from the sensing line SL. That is, the third gate electrode GE3 is integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 112. The third source electrode SE3 may be configured by a conductive material, such as copper (Cu), aluminum (Al), molybdenum (Mo), nickel (Ni), titanium (Ti), and chrome (Cr), or an alloy thereof, but is not limited thereto.

Further, a part of the third active layer ACT3 which is in contact with the third source electrode SE3 may be electrically connected to the light shielding layer LS through a contact hole formed in the upper buffer layer 111. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 112. The third drain electrode DE3 may be configured by a conductive material, such as copper (Cu), aluminum (Al), molybdenum (Mo), nickel (Ni), titanium (Ti), and chrome (Cr), or an alloy thereof, but is not limited thereto.

The third drain electrode DE3 may be electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to electrically connect the reference line RL extending in the column direction to the plurality of sub pixels SP which is disposed in parallel along the row direction. Herein, the auxiliary reference line RLa acts as an intermediary or a bridge to facilitate the electrical connection between the vertical reference lines and the horizontally oriented sub pixels. By having this auxiliary structure, there's increased flexibility in how the system routes and manages electrical connections. The auxiliary reference line RLa extends in the row direction to electrically connect the reference line RL and the third drain electrode DE3 of each of the plurality of sub pixels SP. One end of the auxiliary reference line RLa is electrically connected to the reference line RL through a contact hole formed in the upper buffer layer 111 and the gate insulating layer 112. The other end of the auxiliary reference line RLa may be electrically connected to the third drain electrode DE3 of each of the plurality of sub pixels SP. In this case, the auxiliary reference line RLa may be integrally formed with the third drain electrode DE3 of each of the plurality of sub pixels SP and a reference voltage from the reference line RL may be transmitted to the third drain electrode DE3 by means of the auxiliary reference line RLa. However, the auxiliary reference line RLa may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first storage capacitor electrode SC1 and a second storage capacitor electrode SC2.

In each of the plurality of sub pixels SP, the first storage capacitor electrode SC1 is disposed between the lower buffer layer 116 and the upper buffer layer 111. The first storage capacitor electrode SC1 may be disposed to be the closest to the substrate 110 among the conductive components disposed on the substrate 110. The first storage capacitor electrode SC1 may be integrally formed with the light shielding layer LS and may be electrically connected to the first source electrode SE1 by means of the light shielding layer LS.

The upper buffer layer 111 is disposed on the first storage capacitor electrode SC1 and the second storage capacitor electrode SC2 is disposed on the upper buffer layer 111. The second storage capacitor electrode SC2 may be disposed to overlap with the first storage capacitor electrode SC1. The second storage capacitor electrode SC2 is integrally formed with the second source electrode SE2 to be electrically connected to the second source electrode SE2 and the first gate electrode GE1. For example, the semiconductor material is formed on the upper buffer layer 111 and a part of the semiconductor material is conducted to form the second source electrode SE2 and the second storage capacitor electrode SC2. Accordingly, a part of the semiconductor material which is not conducted functions as a second active layer ACT2 and the conducted part functions as a second source electrode SE2 and the second storage capacitor electrode SC2. As described above, the first gate electrode GE1 is electrically connected to the second source electrode SE2 through the contact hole formed in the gate insulating layer 112. Accordingly, the second storage capacitor electrode SC2 is integrally formed with the second source electrode SE2 to be electrically connected to the second source electrode SE2 and the first gate electrode GE1.

In summary, the first storage capacitor electrode SC1 of the storage capacitor SC is integrally formed with the light shielding layer LS to be electrically connected to the light shielding layer LS, the first source electrode SE1, and the third source electrode SE3. Accordingly, the second storage capacitor electrode SC2 is integrally formed with the second source electrode SE2 and the second active layer ACT2 to be electrically connected to the second source electrode SE2 and the first gate electrode GE1. Accordingly, the first storage capacitor electrode SC1 and the second storage capacitor electrode SC2 which overlap with the upper buffer layer 111 therebetween constantly maintain the voltages of the first gate electrode GE1 and the first source electrode SE1 of the first transistor TR1 to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a plurality of layers of silicon oxide (SiOx) or silicon nitride (SiNx), but is not limited thereto. Further, the passivation layer 113 may also be omitted depending on the exemplary aspect.

A plurality of color filters CF is disposed in the emission area of each of the plurality of sub pixels SP on the passivation layer 113. As described above, the display device 100 according to the exemplary aspect of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and may be implemented as various colors of light. However, the display device 100 according to the exemplary embodiment of the present disclosure may be top emission type, in this case, the placement of the plurality of color filters CF will be adjusted adaptively.

The plurality of color filters CF includes a red color filter CFR, a blue color filter CFB, and a green color filter CFG. The red color filter CFR may be disposed in an emission area of a red sub pixel SPR of the plurality of sub pixels SP, the blue color filter CFB may be disposed in an emission area of the blue sub pixel SPB, and the green color filter CFG may be disposed in an emission area of the green sub pixel SPG.

The planarization layer 114 is disposed on the passivation layer 113 and the plurality of color filters CF and may be configured to protect the first transistor TR1, the second transistor TR2, the third transistor TR3 and to planarize a step caused due to those transistors. The planarization layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, and for example, may be configured by a single layer or a double layer of polyimide, photo acryl, acrylic resin, epoxy resin, phenolic resin, unsaturated polyesters resin, polyphenylene resin, polyphenylene sulfides resin, and benzocyclobutene, but is not limited thereto.

The light emitting diode OLED is disposed in an emission rea of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto. For example, the anode AN may have a multilayer structure including a transparent conductive film.

In the meantime, the anode AN may extend toward the circuit area. A part of the anode AN may extend toward the first source electrode SE1 of the circuit area from the emission area and may be electrically connected to the first source electrode SE1 through a contact hole formed in the planarization layer 114 and the passivation layer 113. Accordingly, the anode AN of the light emitting diode OLED extends to the circuit area to be electrically connected to the first source electrode SE1 of the first transistor TR1 and the second storage capacitor electrode SC2 of the storage capacitor SC.

In the emission area and the circuit area, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may also be configured by one emission layer or may have a structure in which a plurality of emission layers which emits different color light is laminated. The emission layer EL may further include an organic layer, such as one or more of a hole injection layer, a hole transport layer, an electron transport layer, and an electron injection layer, but not limited thereto.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, the cathodes CA of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may also further include a metal doping layer, such as Au, W, Pt, Si, Ir, Ag, Cu, Ni, Ti, or Cr, and an alloy thereof, but is not limited thereto. Even though it is not illustrated in FIGS. 4 and 5, the cathode CA of the light emitting diode OLED is electrically connected to the low potential power line VSS to be supplied with a low potential power voltage.

The bank 115 is disposed between the anode AN and the emission layer EL. The bank 115 is disposed to overlap with the active area AA and cover the edge of the anode AN. The bank 115 is disposed at the boundary between the sub pixels SP which are adjacent to each other to reduce or minimize the color mixture of light emitted from the light emitting diode OLED of each of the plurality of sub pixels SP. The bank 115 may be formed of an insulating material such as, polyimide, acryl, or benzocyclobutene (BCB) resin, epoxy resin, and/or phenolic resin, etc, but it is not limited thereto. Alternatively, the bank 115 may include an inorganic insulating material such as silicon nitride, aluminum nitride, zirconium nitride, titanium nitride, hafnium nitride, tantalum nitride, silicon oxide, aluminum oxide, or titanium oxide, etc.

In the display device 100 according to the exemplary aspect of the present disclosure, the substrate 110 is formed of any one of a transparent conducting oxide and an oxide semiconductor to reduce or minimize a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be lower than a predetermined level. In contrast, the transparent conducting oxide and the oxide semiconductor may be formed to have a very thin thickness by the deposition process such as sputtering. Therefore, in the display device 100 according to the exemplary aspect of the present disclosure, a substrate 110 which supports various components of the display device 100 is configured by a transparent conducting oxide layer or the oxide semiconductor layer to reduce or minimize a thickness of the display device 100 and implement a slim design.

Further, in the display device 100 according to the exemplary aspect of the present disclosure, the substrate 110 is formed of a transparent conducting oxide or an oxide semiconductor to improve the flexibility of the display device 100 and reduce the stress generated when the display device 100 is deformed. Specifically, when the substrate 110 is configured by the transparent conducting oxide layer or the oxide semiconductor, the substrate 110 may be formed as a very thin film, which contributes to the adaptability and malleability of the display, allowing it to conform to various shapes without affecting its performance. In this case, the substrate 110 may also be referred to as a first transparent thin film layer. Accordingly, the display device 100 including a substrate 110 may have a high flexibility and the display device 100 may be easily bent or rolled. Therefore, in the display device 100 according to the exemplary aspect of the present disclosure, the substrate 110 is formed by any one of the transparent conducting oxide layer and the oxide semiconductor to improve the flexibility of the display device 100. Accordingly, the stress generated when the display device 100 is deformed may also be relieved so that the crack caused in the display device 100 may be reduced or minimized.

Further, in the display device 100 according to the exemplary aspect of the present disclosure, the substrate 110 is formed of any one of a transparent conducting oxide layer and an oxide semiconductor layer to reduce the possibility of generating the static electricity in the substrate 110. If the substrate 110 is formed of plastic so that the static electricity is generated, various wiring lines and driving elements on the substrate 110 are damaged or the driving is affected due to the static electricity so that the display quality may be degraded. Instead, when the substrate 110 is formed of the transparent conducting oxide layer or the oxide semiconductor layer, the static electricity generated in the substrate 110 may be reduced or minimized and a configuration for blocking and discharging the static electricity may be simplified. Accordingly, in the display device 100 according to the exemplary aspect of the present disclosure, the substrate 110 is formed of any one of the transparent conducting oxide layer or the oxide semiconductor having a low possibility of generating the static electricity. By doing this, the damage or the display quality degradation due to the static electricity may be reduced or minimized.

Further, in the display device 100 according to the exemplary aspect of the present disclosure, the substrate 110 is formed of one of the transparent conducting oxide and the oxide semiconductor to reduced or minimize the permeation of the moisture or oxygen of the outside into the display device 100 by means of the substrate 110. When the substrate 110 is formed of the transparent conducting oxide layer or the oxide semiconductor, the substrate 110 is formed in the vacuum environment so that the foreign material generation possibility is significantly low. Further, even though the foreign material is generated, the size of the foreign material is very small so that the permeation of the moisture and oxygen into the display device 100 may be reduced or minimized. Accordingly, in the display device 100 according to the exemplary aspect of the present disclosure, the substrate 110 is formed of a transparent conducting oxide or the oxide semiconductor having a low possibility of generating the foreign materials and an excellent moisture permeation preventing performance. By doing this, the reliability of the light emitting diode OLED including an organic layer and the display device 100 may be improved.

In the display device 100 according to the exemplary aspect of the present disclosure, the substrate 110 is formed of any one of a transparent conducting oxide and an oxide semiconductor to attach a barrier film which is thin and chip below the substrate 110. When the substrate 110 is formed of a material having a low moisture permeation preventing performance, for example, plastic, the moisture permeation preventing performance may be supplemented by attaching a high performance barrier film which is thick and expensive. However, in the display device 100 according to the exemplary aspect of the present disclosure, the substrate 110 is formed of a transparent conducting oxide or an oxide semiconductor having an excellent moisture permeation preventing performance so that a thin and cheap barrier film may be attached below the substrate 110. Accordingly, in the display device 100 according to the exemplary aspect of the present disclosure, the substrate 110 is configured by any one of the transparent conducting oxide or the oxide semiconductor having an excellent moisture permeation preventing performance to reduce the manufacturing cost of the display device.

In the display device 100 according to the exemplary aspect of the present disclosure, the substrate 110 is formed of any one of a transparent conducting oxide and an oxide semiconductor to perform a laser lift off (LLO) process. When the display device 100 is manufactured, a temporary substrate in which a sacrificial layer is formed is attached below the substrate 110 and then a pixel unit 120 may be formed on the substrate 110. The sacrificial layer may use a hydrogenated amorphous silicon or an amorphous silicon which is hydrogenated and doped with impurities. After completing the manufacturing of the display device 100, when a laser is irradiated from the lower portion of the temporary substrate, the hydrogen of the sacrificial layer is dehydrogenated and the sacrificial layer and the temporary substrate may be separated from the substrate 110. At this time, the transparent conducting oxide and the oxide semiconductor are materials which may perform the LLO process with the sacrificial layer and the temporary substrate. Therefore, even though the substrate 110 is formed of any one of the transparent conducting oxide or the oxide semiconductor, the substrate 110 may be easily separated from the temporary substrate. Accordingly, in the display device 100 according to the exemplary aspect of the present disclosure, the substrate 110 is configured by any one of the transparent conducting oxide layer or the oxide semiconductor which may perform the LLO process. Therefore, the display device 100 may be easily manufactured with the existing process and equipment.

Hereinafter, an operation of a gate driver of the display device 100 according to the exemplary aspect of the present disclosure will be described with reference to FIGS. 6 and 7.

Figure 6:
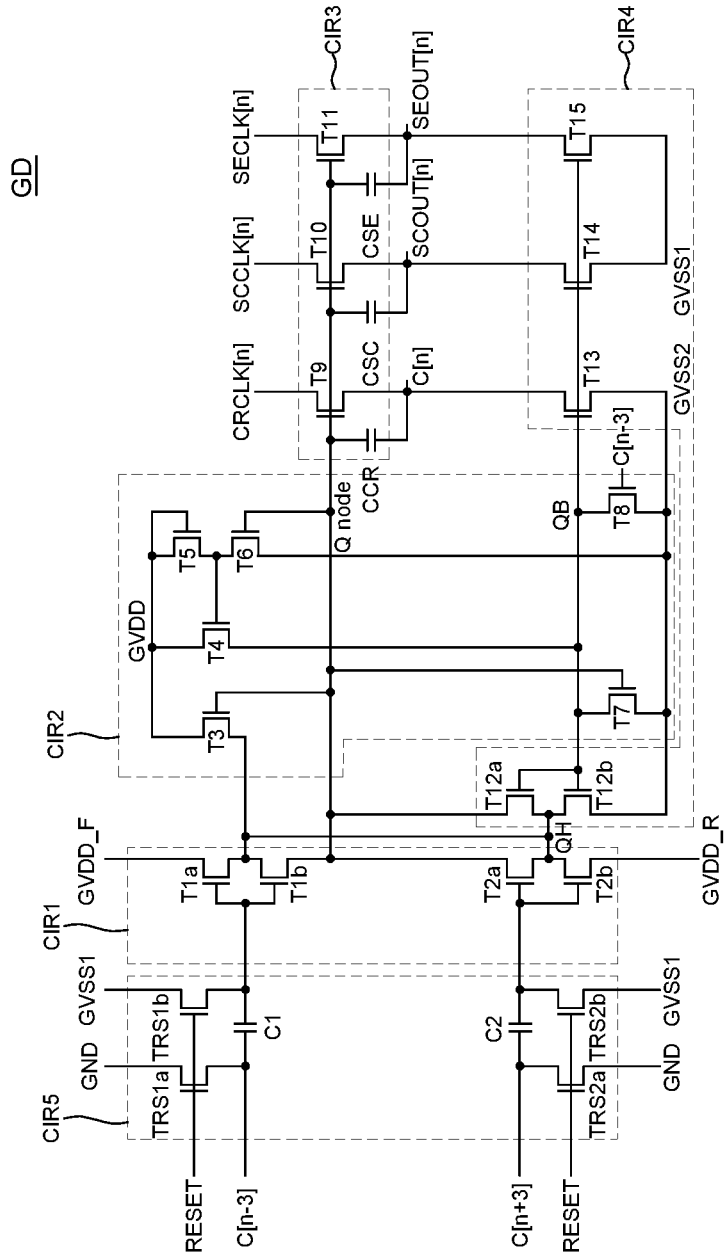
FIG. 6 is an exemplary circuit diagram of a gate driver of a display device according to an exemplary aspect of the present disclosure.
Figure 7:
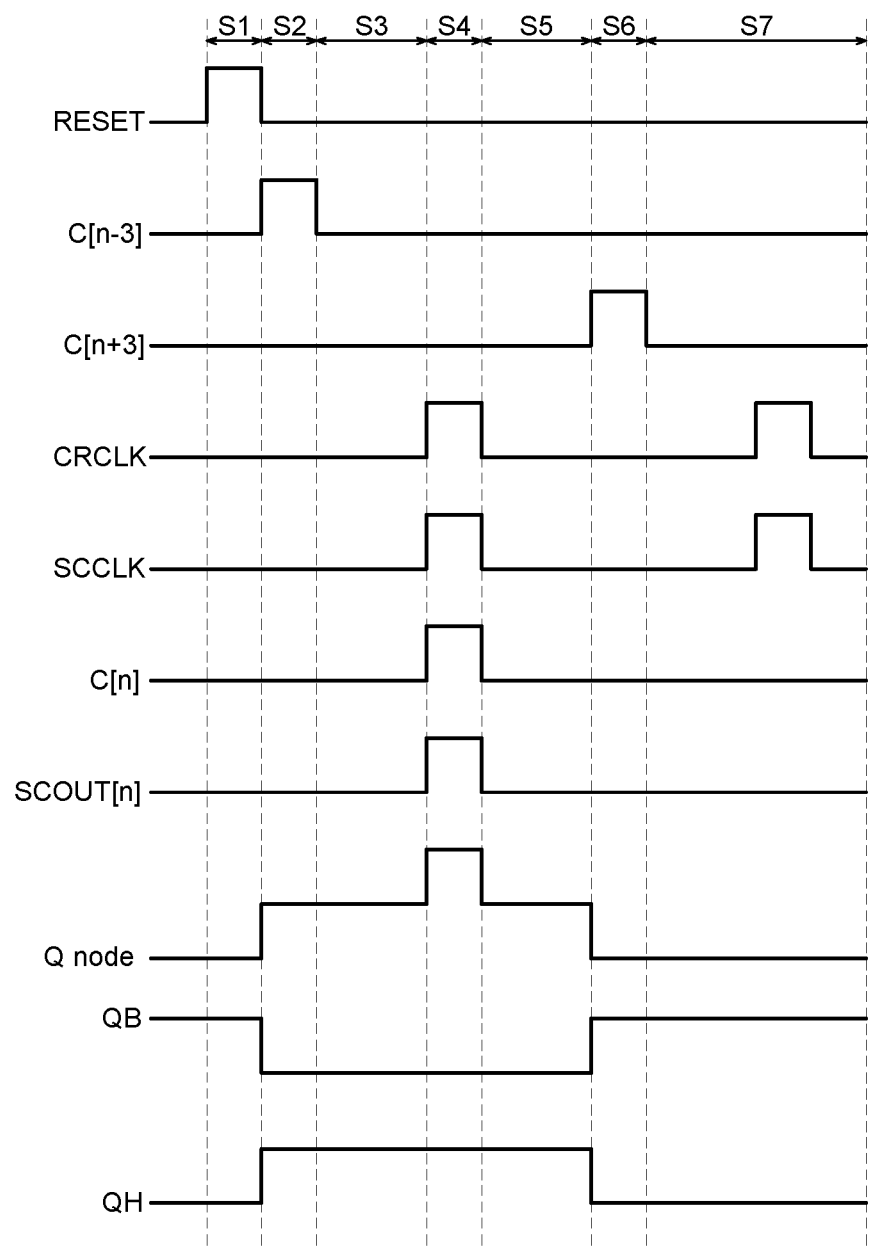
FIG. 7 is a timing diagram for explaining driving of a gate driver of a display device according to an exemplary aspect of the present disclosure.

FIG. 6 is an exemplary circuit diagram of a gate driver of a display device according to an exemplary aspect of the present disclosure. FIG. 7 is a timing diagram for explaining driving of a gate driver of a display device according to an exemplary aspect of the present disclosure. FIG. 6 is a circuit diagram of one stage among a plurality of stages of a gate driver GD. FIG. 7 is a waveform of a signal for explaining a driving characteristic of a gate driver GD for every section.

The gate driver GD may include a plurality of stages which outputs a scan signal and a sense signal. Each of the plurality of stages generates a scan signal and a sense signal based on gate shift clocks including a carry clock line CRCLK[n], a scan clock line SCCLK[n], and a sense clock line SECLK[n] from a timing controller and a gate start signal.

Referring to FIG. 6, the gate driver GD includes a first circuit unit CIR1, a second circuit unit CIR2, a third circuit unit CIR3, a fourth circuit unit CIR4, and a fifth circuit unit CIR5.

The first circuit unit CIR1 is a Q node charging/discharging circuit which charges or discharges a Q node in response to a signal and a voltage input from the fifth circuit unit CIR5, a forward high potential voltage line GVDD_F, and a reverse high potential voltage line GVDD_R. When the Q node is in a charging state, a QB node QB is in a discharging state. The first circuit unit CIR1 includes a 1a-th transistor T1a, a 1b-th transistor T1b, a 2a-th transistor T2a, and a 2b-th transistor T2b. The 1a-th transistor T1a and the 1b-th transistor T1b configure one input terminal of the first circuit unit CIR1 and a 2a-th transistor T2a and a 2b-th transistor T2b configure the other input terminal of the first circuit unit CIR1.

The second circuit unit CIR2 is a QB node charging/discharging circuit which discharges or charges the QB node QB in response to a potential of the Q node. When the QB node QB is in a charging state, a Q node is in a discharging state. The second circuit unit CIR2 serves to switch the charging/discharging between the Q node and the QB node so that it may also be defined as an inverter circuit unit. The second circuit unit CIR2 includes a third transistor T3, a fourth transistor T4, a fifth transistor T5, a sixth transistor T6, a seventh transistor T7, and an eighth transistor T8. The third transistor T3, the fourth transistor T4, the fifth transistor T5, the sixth transistor T6, the seventh transistor T7, and the eighth transistor T8 control the charging/discharging of the Q node and the QB node QB.

The third circuit unit CIR3 is an output buffer circuit which uses a potential of the Q node as a signal of the gate electrode and sends a clock signal applied from the outside to its own output (gate driver) in response to the potential of the Q node. That is, the third circuit unit CIR3 has a bootstrap function by a capacitor provided therein. The third circuit unit CIR3 outputs carry, scan, and sense clock signals supplied from a carry clock line CRCLK[n], a scan clock line SCCLK[n], and a sense clock line SECLK[n] to its own output terminals C[n], SCOUT[n], and SEOUT[n]. The third circuit unit CIR3 includes a ninth transistor T9, a tenth transistor T10, an eleventh transistor T11, a carry boot capacitor CCR, a scan boot capacitor CSC, and a sense boot capacitor CSE. At this time, the carry boot capacitor CCR is connected to a first output terminal C[n] of the gate driver GD, the scan boot capacitor CSC is connected to a second output terminal SCOUT[n] of the gate driver GD, and the sense boot capacitor CSE is connected to a third output terminal SEOUT[n] of the gate driver GD. Therefore, the ninth transistor T9 outputs a carry clock signal through the first output terminal C[n] of the gate driver GD and the tenth transistor T10 outputs a scan clock signal through the second output terminal SCOUT[n] of the gate driver GD. Further, the eleventh transistor T11 outputs the sense clock signal through the third output terminal SEOUT[n] of the gate driver GD.

The fourth circuit unit CIR4 is a stabilization circuit which uses a potential of the QB node QB as a signal of the gate electrode and stabilizes a ripple of the Q node and the output terminal during a section in which the fourth circuit unit is not driven, in response to the potential of the QB node QB. There is a QH node QH between the first circuit unit CIR1 and the fourth circuit unit CIR4. The fourth circuit unit CIR4 includes a 12a-th transistor T12a, a 12b-th transistor T12b, a thirteenth transistor T13, a fourteenth transistor T14, and a fifteenth transistor T15. The 12a-th transistor T12a, the 12b-th transistor T12b, the thirteenth transistor T13, the fourteenth transistor T14, and the fifteenth transistor T15 stabilize the ripple.

The fifth circuit unit CIR5 is a compensation circuit unit which supplements or compensates a problem of a leakage current caused by the movement of the threshold voltage of transistors which configure the first circuit unit CIR1. The fifth circuit unit CIR5 serves to form a compensation voltage which is lower than the threshold voltage of the transistors which configure the first circuit unit CIR1. In other words, the fifth circuit unit CIR5 forms a gate source voltage which is lower than the threshold voltage of the transistors which configure the first circuit unit CIR1. The fifth circuit unit CIR5 includes one compensation unit and the other compensation unit. One compensation unit includes a 1a-th compensation transistor TRS1*a*, a 1b-th compensation transistor TSR1*b*, and a first compensation capacitor C1. The other compensation unit includes a 2a-th compensation transistor TRS2*a*, a 2b-th compensation transistor TRS2*b*, and a second compensation capacitor C2.

A connection relationship of elements included in the first circuit unit CIR1 to fifth circuit unit CIR5 will be described below.

A gate electrode of the 1a-th transistor T1*a* is connected to a second electrode of the 1b-th compensation transistor TRS1*b* and the other end of the first compensation capacitor C1 included in one compensation unit of the fifth circuit unit CIR5. A first electrode of the 1a-th transistor T1*a* is connected to a forward high potential voltage line GVDD_F and a second electrode is connected to the first electrode of the 1b-th transistor T1*b*. A gate electrode of the 1b-th transistor T1*b* is connected to the gate electrode of the 1a-th transistor T1*a*, a first electrode is connected to the second electrode of the 1a-th transistor T1*a*, and a second electrode is connected to the first electrode of the 2a-th transistor T2*a*. A gate electrode of the 2a-th transistor T2*a* is connected to a first electrode of the 2b-th compensation transistor TRS2*b* and the other end of the second compensation capacitor C2 included in the other compensation unit of the fifth circuit unit CIR5. A first electrode of the 2a-th transistor is connected to the second electrode of the 1b-th transistor T1*b* and a second electrode is connected to the first electrode of the 2b-th transistor T2*b*. A gate electrode of the 2b-th transistor T2*b* is connected to the gate electrode of the 2a-th transistor T2*a*, a first electrode is connected to the second electrode of the 2a-th transistor T2*a*, and a second electrode is connected to the reverse high potential voltage line GVDD_R.

A gate electrode of the third transistor T3 is connected to a Q node, a first electrode is connected to the high potential voltage line GVDD, and a second electrode is connected to the second electrode of the 1a-th transistor T1*a* and the first electrode of the 1b-th transistor T1*b* of the first circuit unit CIR1. A gate electrode of the fourth transistor T4 is connected to the second electrode of the fifth transistor T5 and the first electrode of the sixth transistor T6, a first electrode is connected to the high potential voltage line GVDD, and a second electrode is connected to the QB node QB. A first electrode and the gate electrode of the fifth transistor T5 is connected to the high potential voltage line GVDD and a second electrode is connected to the first electrode of the sixth transistor T6. A gate electrode of the sixth transistor T6 is connected to the Q node, a first electrode is connected to the second electrode of the fifth transistor T5, and a second electrode is connected to a second low potential voltage line GVSS2. A gate electrode of the seventh transistor T7 is connected to the Q node, a first electrode is connected to the QB node QB, and a second electrode is connected to the second low potential voltage line GVSS2. A gate electrode of the eighth transistor T8 is connected to a first output terminal C[n−3] of an n−3-th stage circuit unit, a first electrode is connected to the QB node QB, and a second electrode is connected to the second low potential voltage line GVSS2.

A gate electrode of the ninth transistor T9 is connected to the Q node, a first electrode is connected to the carry clock line CRCLK[n], and a second electrode is connected to the first output terminal C[n] of the gate driver GD. One end of the carry boot capacitor CCR is connected to the Q node and the other end is connected to the first output terminal C[n] of the gate driver GD. A gate electrode of the tenth transistor T10 is connected to the Q node, a first electrode is connected to the scan clock line SCCLK[n], and a second electrode is connected to the second output terminal SCOUT[n] of the gate driver GD. One end of the scan boot capacitor CSC is connected to the Q node and the other end is connected to the second output terminal SCOUT[n] of the gate driver GD. A gate electrode of the eleventh transistor T11 is connected to the Q node, a first electrode is connected to the sense clock line SECLK[n], and a second electrode is connected to the third output terminal SEOUT[n] of the gate driver GD. One end of the sense boot capacitor CSE is connected to the Q node and the other end is connected to the third output terminal SEOUT[n] of the gate driver GD. A gate electrode of the 12a-th transistor T12*a* is connected to the QB node QB, a first electrode is connected to the Q node, and a second electrode is connected to the first electrode of the 12b-th transistor T12*b*. A gate electrode of the 12b-th transistor T12*b* is connected to the QB node QB, a first electrode is connected to the second electrode of the 12a-th transistor T12*a*, and a second electrode is connected to the second low potential voltage line GVSS2. A node to which the second electrode of the 12a-th transistor T12*a* and the first electrode of the 12b-th transistor T12*b* are connected is a QH node QH. The QH node is also connected to the second electrode of the 2a-th transistor T2*a* and the first electrode of the 2b-th transistor T2*b* of the first circuit unit CIR1. A gate electrode of the thirteenth transistor T13 is connected to the QB node QB, a first electrode is connected to the first output terminal C[n] of the gate driver GD, and a second electrode is connected to the second low potential voltage line GVSS2. A gate electrode of the fourteenth transistor T14 is connected to the QB node QB, a first electrode is connected to the second output terminal SCOUT[n] of the gate driver GD, and a second electrode is connected to the first low potential voltage line GVSS1. A gate electrode of the fifteenth transistor T15 is connected to the QB node QB, a first electrode is connected to the third output terminal SEOUT[n] of the gate driver GD, and a second electrode is connected to the first low potential voltage line GVSS1.

A gate electrode of the 1a-th compensation transistor TRS1*a* is connected to a reset signal line RESET, a first electrode is connected to a ground voltage line GND, and a second electrode is connected to the first output terminal C[n−3] of an N−3-th stage circuit unit. An N−3-th carry signal is output to the first output terminal C[n−3] of the N−3-th stage circuit unit. A gate electrode of the 1b-th compensation transistor TRS1*b* is connected to the reset signal line RESET, a first electrode is connected to the first low potential voltage line GVSS1, and a second electrode is connected to one input terminal of the first circuit unit CIR1. One end of the first compensation capacitor C1 is connected to the first output terminal C[n−3] of the N−3-th stage circuit unit and the other end is connected to one input terminal of the first circuit unit CIR1. A gate electrode of the 2a-th compensation transistor TRS2*a* is connected to the reset signal line RESET, a first electrode is connected to the ground voltage line GND, and a second electrode is connected to a first output terminal C[n+3] of an N+3-th stage circuit unit. An N+3-th carry signal is output to the first output terminal C[n+3] of the N+3-th stage circuit unit. A gate electrode of the 2b-th compensation transistor TRS2*b* is connected to the reset signal line RESET, a first electrode is connected to the first low potential voltage line GVSS1, and a second electrode is connected to the other input terminal of the first circuit unit CIR1. One end of the second compensation capacitor C2 is connected to the first output terminal C[n+3] of the N+3-th stage circuit unit and the other end is connected to the other input terminal of the first circuit unit CIR1.

Hereinafter, a driving characteristic of a gate driver of the display device according to an exemplary aspect of the present disclosure in every section will be described with reference to FIG. 7 together.

During a first section S1, only a reset signal RESET is input to be logic high. At this time, the other signals maintain logic low or are not input. When the reset signal is input to be logic high, one compensation unit and the other compensation unit of the fifth circuit unit CIR5 are initialized. Due to the initialization operation of one compensation unit and the other compensation unit of the fifth circuit unit CIR5, a voltage which is lower than threshold voltages of the transistors T1a, T1b, T2a, and T2b of the first circuit unit is formed in the first and second compensation capacitors C1 and C2. The reset signal RESET forms a logic high at least once per frame and maintains a logic low thereafter.

As described above, voltages applied to both ends of the first and second compensation capacitors C1 and C2 are lower than the threshold voltage Vth of transistors T1a, T1b, T2a, and T2c of the first circuit unit CIR1. Therefore, leakage current generated in the transistors T1a, T1b, T2a, and T2b of the first circuit unit CIR1 is suppressed by the fifth circuit unit CIR5. To this end, a compensation voltage Vc1 initialized between the first and second compensation capacitors C1 and C2 are set as Vc1<Vth. Here, Vc1 is a voltage formed by one compensation unit (a voltage equation is also formed in the other compensation unit) of the fifth circuit unit CIR5 and Vth is a threshold voltage of a transistor which configures the first circuit unit CIR1.

During a second section S2, a reset signal RESET becomes logic low. The N−3-th carry signal C[n−3] is input to be logic high, but the N+3-th carry signal C[n+3] is input to be logic low. During the second section S2, a logic high voltage starts to be applied to the Q node. Like the Q node, the logic high voltage is also input to the QH node QH. However, a logic low voltage is applied to the QB node QB.

During a third section S3, the N−3-th carry signal C[n−3] and the N+3-th carry signal C[n+3] are input to be logic low. During the third section S3, a logic high voltage is charged in the Q node. Like the Q node, the logic high voltage is charged in the QH node QH. However, the QB node QB is discharged by the logic low voltage.

During a fourth section S4, carry and scan clock signals CRCLK and SCCLK are input to be logic high. Even though the sense clock signal is not illustrated, the sense clock may be the same as or different from carry and scan clock signals CRCLK and SCCLK. During the fourth section S4, the bootstrap is caused by the carry boot capacitor CCR, the scan boot capacitor CSC, and the sense boot capacitor CSE and a potential of the Q node rises as compared with the pervious section. In response to the potential of the Q node, the carry and scan clock signals CRCLK and SCCLK are output through the first output terminal C[n] and the second output terminal SCOUT[n] of the gate driver GD.

During a fifth section S5, the charging of the Q node and the QH node QH are maintained and the discharging of the QB node QB is maintained. Therefore, the outputs of the first output terminal C[n] and the second output terminal SCOUT[n] of the gate driver GD are stabilized.

During a sixth section S6, the N−3-th carry signal C [n−3] is maintained to be logic low but the N+3-th carry signal C[n+3] is input to be logic high. During the sixth section S6, a logic low voltage is applied to the Q node so that the Q node starts to be discharged.

As a logic low voltage is applied to the QH node QH as in the Q node, so that the QH node starts to be discharged. However, a logic high voltage is applied to the QB node QB so that the QB node starts to be charged.

During a seventh section S7, the N−3-th carry signal C[n−3] and the N+3-th carry signal C[n+3] are maintained to be logic low. Accordingly, the first output terminal C[n] and the second output terminal SCOUT[n] of the gate driver GD are maintained to a logic low output.

In the meantime, even though as a circuit applicable to the gate driver GD, the specification has been described based on the circuit illustrated in FIG. 6, a circuit applicable to the gate driver GD is not limited thereto. That is, as long as the circuit performs the bootstrap using the Q node and uses a capacitor connected to the Q node to maintain the voltage of the Q node, all the circuits may be applicable to the gate driver GD of the present specification.

Hereinafter, a Q node shielding layer QS disposed in the gate driver GD of the display device 100 according to the exemplary aspect of the present disclosure will be described in more detail with reference to FIGS. 8A and 8B.

Figure 8A:
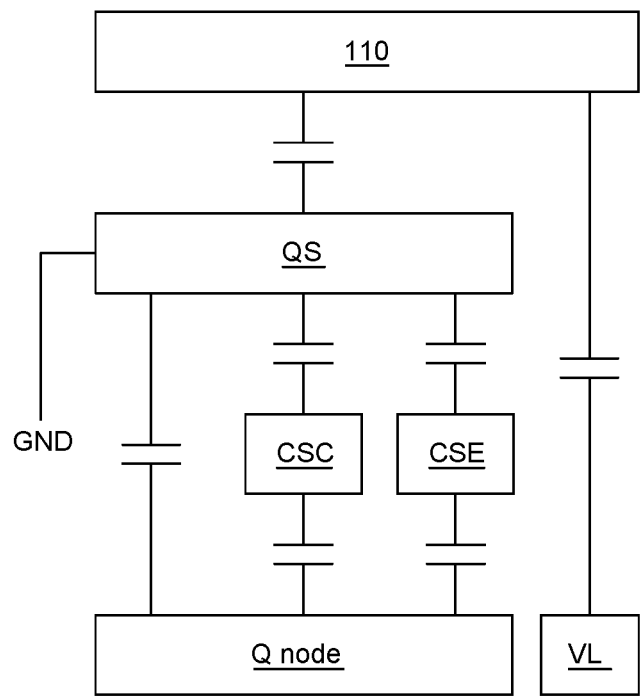
FIG. 8A is a schematic diagram of a gate driver of a display device according to an exemplary aspect of the present disclosure.

FIG. 8A is a schematic diagram of a gate driver of a display device according to an exemplary aspect of the present disclosure. FIG. 8B is a schematic cross-sectional view of a gate driver of a display device according to an exemplary aspect of the present disclosure. In FIG. 8A, for the convenience of description, among various configurations of the display device 100, only a substrate 110, a Q node, a Q node shielding layer QS, a plurality of capacitors CSC and CSE, and a portion VL which has a potential different from the Q node are schematically illustrated. Further, in FIG. 8B, for the convenience of description, among various configurations of the display device 100, only a polarizer 150, a substrate 110, an additional buffer layer 117, a Q node shielding layer QS, a lower buffer layer 116, an upper buffer layer 111, a gate insulating layer 112, a passivation layer 113, a Q node, and a sense boot capacitor CSE are illustrated.

Figure 8B:
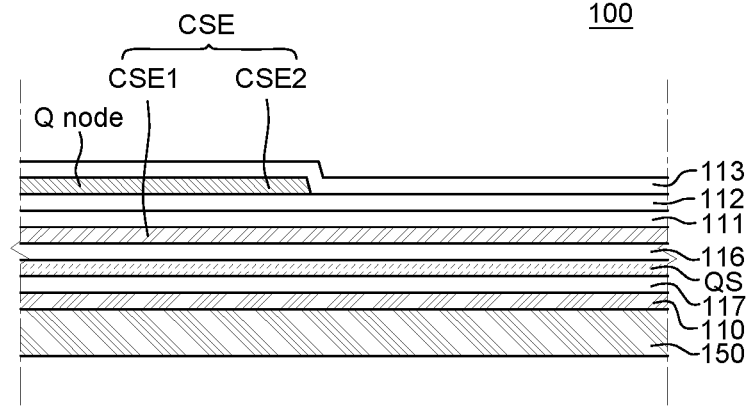
FIG. 8B is a schematic cross-sectional view of a gate driver of a display device according to an exemplary aspect of the present disclosure.

Referring to FIGS. 8A and 8B, an additional buffer layer 117 is disposed on the substrate 110 in the gate driver GD. The additional buffer layer 117 may be disposed only in an area of the non-active area NA in which the gate driver GD is disposed, but is not limited thereto and may also be formed in both the active area AA and the non-active area NA on the substrate 110. For example, the additional buffer layer 117 may be configured by a single layer or a plurality of layers of silicon oxide (SiOx) or silicon nitride (SiNx), but is not limited thereto.

The Q node shielding layer QS is disposed on the upper buffer layer 111. The Q node shielding layer QS is directly connected to the Q node of the gate driver GD to overlap with only the Q node line having the same potential as the Q node. That is, the Q node shielding layer QS does not overlap with the portion VL having the different potential from that of the Q node of the gate driver GD.

The Q node shielding layer QS may be formed of a metal material. For example, the Q node shielding layer QS may be formed of a molybdenum titanium (MoTi) alloy. However, any metal material which may block the parasitic capacitance generated between the Q node and the substrate 110 may be selected for the Q node shielding layer QS without being limited.

The lower buffer layer 116, the upper buffer layer 111, the gate insulating layer 112, and the passivation layer 113 are disposed on the Q node shielding layer QS.

Further, a plurality of capacitors CSC and CSE connected to the Q node may be disposed above the lower buffer layer 116. As illustrated in FIG. 6, the plurality of capacitors CSC and CSE may be a scan boot capacitor CSC and the sense boot capacitor CSE. Even though in FIG. 8B, for the convenience of description, only the sense boot capacitor CSE among the plurality of capacitors CSC and CSE is illustrated, the scan boot capacitor CSC may also be applied in the same way.

The first electrode CSE1 of the sense boot capacitor CSE may be disposed on the lower buffer layer 116. The first electrode CSE1 of the sense boot capacitor CSE may be formed by the same material as the light shielding layer LS disposed in the active area AA, but is not limited thereto.

The upper buffer layer 111 may be disposed on the first electrode CSE1 of the sense boot capacitor CSE. The upper buffer layer 111 may be formed on the same layer as the upper buffer layer 111 disposed in the active area AA by the same process.

The gate insulating layer 112 may be disposed on the upper buffer layer 111. The gate insulating layer 112 may be formed on the same layer as the gate insulating layer 112 disposed in the active area AA by the same process.

The second electrode CSE2 of the sense boot capacitor CSE may be disposed on the gate insulating layer 112. The second electrode CSE2 of the sense boot capacitor CSE may be an electrode which is directly connected to the Q node. The second electrode CSE2 of the sense boot capacitor CSE may be formed by the same material as the first gate electrode GE1 of the first transistor TR1 disposed in the active area AA, but is not limited thereto.

Referring to FIG. 8A, the Q node shielding layer QS is applied with a ground voltage. For example, the Q node shielding layer QS is connected to the ground voltage line GND to be applied with the ground voltage so that the Q node shielding layer QS may have the same potential as the ground potential.

As described above, in the display device 100 according to the exemplary aspect of the present disclosure, to solve the problem caused when a plastic substrate is used, one of a transparent conducting oxide layer and an oxide semiconductor layer is used for the substrate 110. However, there is no potential supplied to the substrate 110 formed by one of the transparent conducting oxide layer and the oxide semiconductor layer, so that the substrate 110 is disposed in a floating potential state. At this time, a parasitic capacitance may be generated between the Q node, among components disposed above the substrate 110 formed by one of the transparent conducting oxide layer and the oxide semiconductor layer, and the substrate 110 during the panel driving. As described above, when the parasitic capacitance is generated between the Q node and the substrate 110, the bootstrap of the Q node is not smoothly formed so that there may also be a problem in that the Q node may not be normally boosted.

Accordingly, in the display device 100 according to the exemplary aspect of the present disclosure, the Q node shielding layer QS is disposed between the substrate 110 and the Q node so that the parasitic capacitance between the substrate 110 and the Q node may be reduced or minimized. Specifically, the Q node shielding layer QS which may block the parasitic capacitance to be generated between the substrate 110 and the Q node is disposed and the Q node shielding layer QS may be disposed so as not to overlap with the portion VL having a different potential from that of the Q node. Further, the Q node shielding layer QS is applied with the ground voltage to block the parasitic capacitance between the Q node and the substrate 110. Accordingly, in the display device 100 according to the exemplary aspect of the present disclosure, the Q node shielding layer QS which is applied with the ground voltage is disposed between the substrate 110 and the Q node to reduced or minimize the parasitic capacitance between the substrate 110 and the Q node. Further, the bootstrap of the Q node is normally implemented to suppress signal delay or driving failure which may be caused in the gate driver GD to improve the reliability of the display device 100.

Figure 9A:
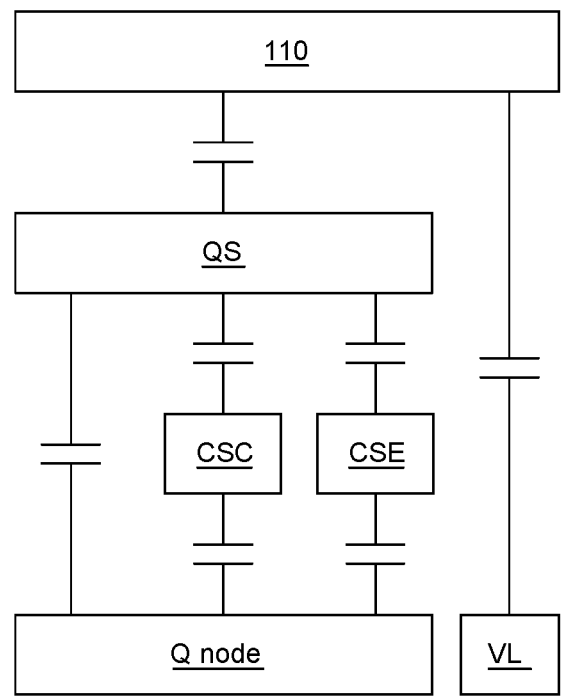
FIG. 9A is a schematic diagram of a gate driver of a display device according to another exemplary aspect of the present disclosure.
Figure 9B:
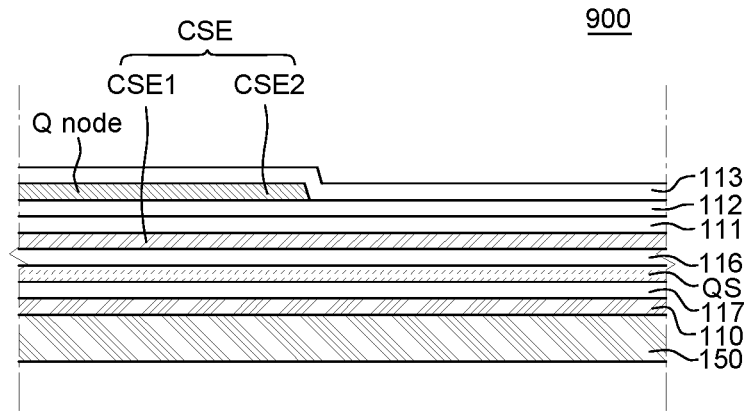
FIG. 9B is a schematic cross-sectional view of a gate driver of a display device according to another exemplary aspect of the present disclosure.

FIG. 9A is a schematic diagram of a gate driver of a display device according to another exemplary aspect of the present disclosure. FIG. 9B is a schematic cross-sectional view of a gate driver of a display device according to another exemplary aspect of the present disclosure. In FIG. 9A, for the convenience of description, among various configurations of the display device 900, only a substrate 110, a Q node, a Q node shielding layer QS, a plurality of capacitors CSC and CSE, and a portion VL which has a potential different from the Q node are schematically illustrated. Further, in FIG. 9B, for the convenience of description, among various configurations of the display device 900, only a polarizer 150, a substrate 110, an additional buffer layer 117, a Q node shielding layer QS, a lower buffer layer 116, an upper buffer layer 111, a gate insulating layer 112, a passivation layer 113, a Q node, and a sense boot capacitor CSE are illustrated. As compared with the display device 100 of FIGS. 1 to 8B, a display device 900 of FIGS. 9A and 9B includes other configurations which are substantially the same, except that the Q node shielding layer QS is electrically floated, so that a redundant description will be omitted or be briefly provided.

Referring to FIGS. 9A and 9B, in the display device according to another exemplary aspect of the present disclosure, the Q node shielding layer QS is electrically floated. Specifically, the Q node shielding layer QS is disposed to overlay only the Q node and a Q node line having the same potential as the Q node and does not overlap with the portion VL of the gate driver GD having a different potential from the Q node. At this time, the Q node shielding layer QS is not electrically connected to the other conductive component. That is, a separate voltage is not applied to the Q node shielding layer QS, but the Q node shielding layer may be electrically floated.

In the display device 900 according to another exemplary aspect of the present disclosure, the Q node shielding layer QS is disposed between the substrate 110 and the Q node so that the parasitic capacitance between the substrate 110 and the Q node may be reduced or minimized. Specifically, the Q node shielding layer QS which may block the parasitic capacitance to be generated between the substrate 110 and the Q node is disposed and the Q node shielding layer QS may be disposed so as not to overlap with the portion VL having a different potential from that of the Q node. Further, the Q node shielding layer QS is electrically floated to block the parasitic capacitance between the Q node and the substrate 110. Accordingly, in the display device according to another exemplary aspect of the present disclosure, the Q node shielding layer QS which is electrically floated is disposed between the substrate 110 and the Q node to reduced or minimize the parasitic capacitance between the substrate 110 and the Q node. Further, the bootstrap of the Q node is normally implemented to suppress signal delay or driving failure which may be caused in the gate driver GD to improve the reliability of the display device 900.

Figure 10A:
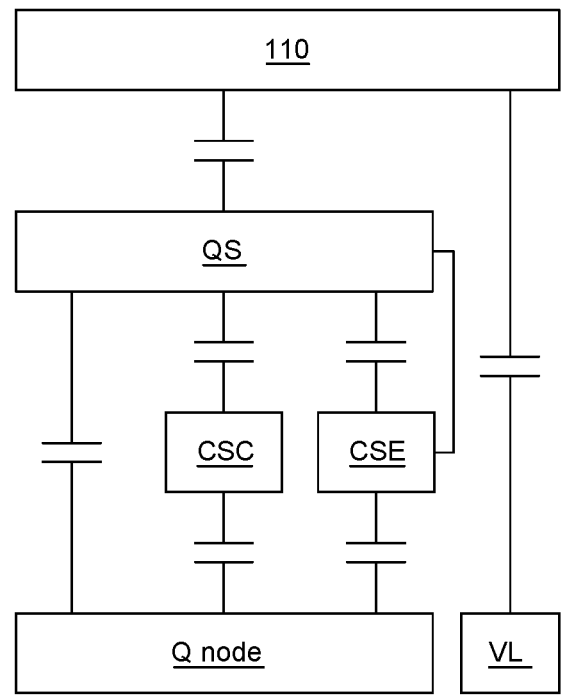
FIG. 10A is a schematic diagram of a gate driver of a display device according to still another exemplary aspect of the present disclosure.
Figure 10B:
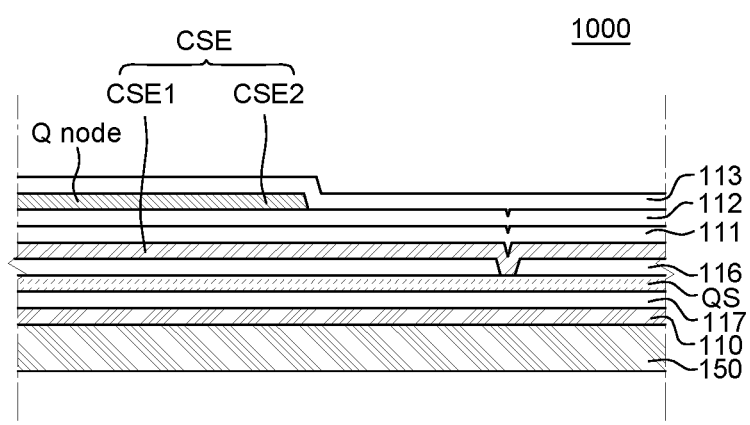
FIG. 10B is a schematic cross-sectional view of a gate driver of a display device according to still another exemplary aspect of the present disclosure.

FIG. 10A is a schematic diagram of a gate driver of a display device according to still another exemplary aspect of the present disclosure. FIG. 10B is a schematic cross-sectional view of a gate driver of a display device according to still another exemplary aspect of the present disclosure. In FIG. 10A, for the convenience of description, among various configurations of the display device, only a substrate 110, a Q node, a Q node shielding layer QS, a plurality of capacitors CSC and CSE, and a portion VL which has a potential different from the Q node are schematically illustrated. Further, in FIG. 10B, for the convenience of description, among various configurations of the display device 1000, only a polarizer 150, a substrate 110, an additional buffer layer 117, a Q node shielding layer QS, a lower buffer layer 116, an upper buffer layer 111, a gate insulating layer 112, a passivation layer 113, a Q node, and a sense boot capacitor CSE are illustrated. As compared with the display device 100 of FIGS. 1 to 8B, a display device 1000 of FIGS. 10A and 10B includes other configurations which are substantially the same, except that the Q node shielding layer QS is electrically connected to one electrode of a sense boot capacitor CSE, that is a first electrode CSE1. Accordingly, a redundant description will be omitted or be briefly provided.

Referring to FIGS. 10A and 10B, the Q node shielding layer QS is disposed to overlay only the Q node and a Q node line having the same potential as the Q node and does not overlap with the portion VL of the gate driver GD having a different potential from the Q node. At this time, the Q node shielding layer QS is electrically connected to the first electrode CSE1 of the sense boot capacitor CSE. Specifically, the Q node shielding layer QS and the first electrode CSE1 of the sense boot capacitor CSE may be electrically connected through a contact hole. For example, referring to FIGS. 10A and 10B, the Q node shielding layer QS is in direct contact with the first electrode CSE1 of the sense boot capacitor CSE to be electrically connected. However, it is not limited thereto and the Q node shielding layer may be electrically connected to one electrode of the scan boot capacitor CSE. For example, the Q node shielding layer QS is in direct contact with the first electrode of the scan boot capacitor CSE to be electrically connected.

In the display device 1000 according to still another exemplary aspect of the present disclosure, the Q node shielding layer QS is disposed between the substrate 110 and the Q node so that the parasitic capacitance between the substrate 110 and the Q node may be minimized. Specifically, the Q node shielding layer QS which may block the parasitic capacitance to be generated between the substrate 110 and the Q node is disposed and the Q node shielding layer QS may be disposed so as not to overlap with the portion VL having a different potential from that of the Q node. Further, the Q node shielding layer QS is electrically connected to one electrode of one of the capacitors among the sense boot capacitor CSE and the scan boot capacitor CSC to block the parasitic capacitance between the Q node and the substrate 110. Accordingly, in the display device according to still another exemplary aspect of the present disclosure, the Q node shielding layer QS which is electrically connected to one electrode of one of the capacitors among the sense boot capacitor CSE and the scan boot capacitor CSC is disposed between the substrate 110 and the Q node to minimize the parasitic capacitance between the substrate 110 and the Q node. Further, the bootstrap of the Q node is normally implemented to suppress signal delay or driving failure which may be caused in the gate driver GD to improve the reliability of the display device 1000.

Figure 11A:
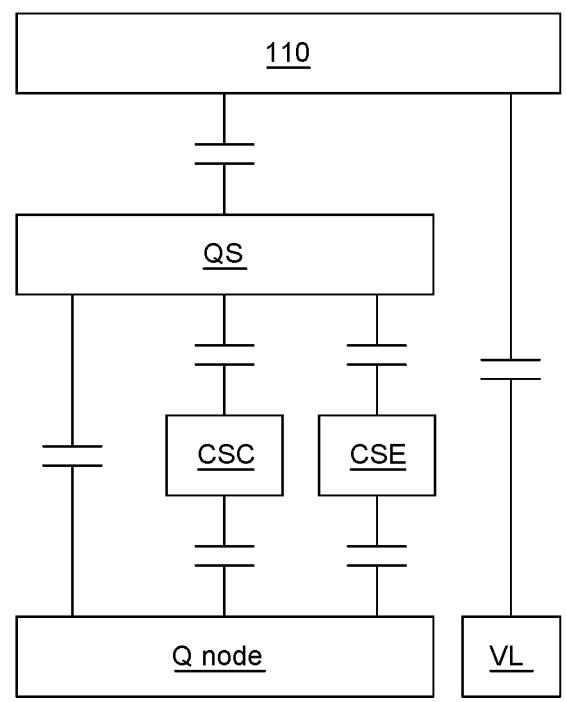
FIG. 11A is a schematic diagram of a gate driver of a display device according to still another exemplary aspect of the present disclosure.
Figure 11B:
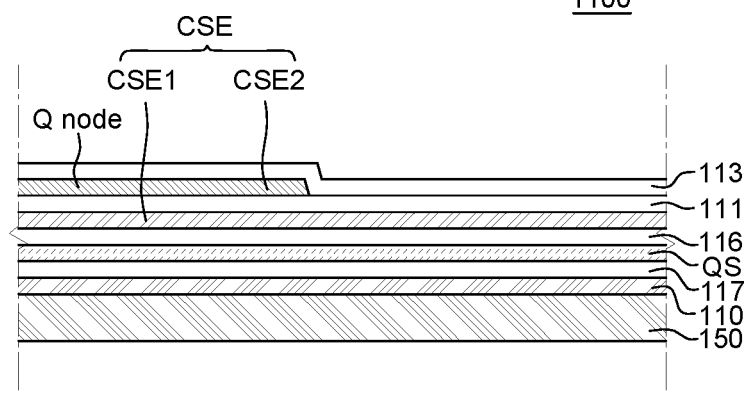
FIG. 11B is a schematic cross-sectional view of a gate driver of a display device according to still another exemplary aspect of the present disclosure.

FIG. 11A is a schematic diagram of a gate driver of a display device according to still another exemplary aspect of the present disclosure. FIG. 11B is a schematic cross-sectional view of a gate driver of a display device according to still another exemplary aspect of the present disclosure. In FIG. 11A, for the convenience of description, among various components of the display device 1100, only a substrate 110, a Q node, a Q node shielding layer QS, a plurality of capacitors CSC and CSE, and a portion VL which has a potential different from the Q node are schematically illustrated. Further, in FIG. 11B, for the convenience of description, among various components of the display device 1100, only a polarizer 150, a substrate 110, an additional buffer layer 117, a Q node shielding layer QS, a lower buffer layer 116, an upper buffer layer 111, a passivation layer 113, a Q node, and a sense boot capacitor CSE. As compared with the display device 900 of FIGS. 9A and 9B, in the display device 1100 of FIGS. 11A and 11B, a gate insulating layer 112 is not provided, but the other configurations are substantially the same so that a redundant description will be omitted or be briefly provided.

Referring to FIG. 11B, the display device 1100 according to still another exemplary aspect of the present disclosure is configured such that the gate insulating layer 112 is not disposed between the first electrode CSE1 and the second electrode CSE2 of the sense boot capacitor CSE. Therefore, a signal delay or a driving failure which may be generated in the gate driver GD is reduced or minimized to improve the reliability of the display device.

Even though in FIG. 11B, for the convenience of description, only the sense boot capacitor CSE among the plurality of capacitors CSC and CSE is illustrated, the scan boot capacitor CSC may also be applied in the same way.

Specifically, in the display device 1100 according to still another exemplary aspect of the present disclosure, only the upper buffer layer 111 is disposed in an area where the first electrode CSE1 and the second electrode CSE2 with each other between the first electrode CSE1 and the second electrode CSE2 of the sense boot capacitor CSE. However, the gate insulating layer 112 is not disposed. Therefore, a distance between the first electrode CSE1 and the second electrode CSE2 of the sense boot capacitor CSE may be reduced as much as the thickness by which the gate insulating layer 112 is removed. A capacitance of the capacitor is increased as the distance between electrodes of the capacitor is reduced so that as the distance between the first electrode CSE1 and the second electrode CSE2 of the sense boot capacitor CSE is reduced, the capacitance of the sense boot capacitor CSE may be increased. Therefore, a voltage may be more stably applied to the Q node connected to the sense boot capacitor CSE so that the bootstrap of the Q node may be normally implemented. Therefore, the signal delay or the driving failure which may be generated in the gate driver GD is reduced or minimized to improve the reliability of the display device 1100. Accordingly, the display device 1100 according to still another exemplary aspect of the present disclosure is configured such that the gate insulating layer 112 is not disposed between the first electrode CSE1 and the second CSE2 of the sense boot capacitor CSE. Therefore, a signal delay or a driving failure which may be generated in the gate driver GD is reduced or minimized to improve the reliability of the display device.

In the meantime, referring to FIGS. 11A and 11B, in the display device 1100 according to another exemplary aspect of the present disclosure, the Q node shielding layer QS is electrically floated. Specifically, the Q node shielding layer QS is disposed to overlay only the Q node and a Q node line having the same potential as the Q node and does not overlap with the portion VL of the gate driver GD having a different potential from the Q node. At this time, the Q node shielding layer QS is not electrically connected to the other conductive component. That is, a separate voltage is not applied to the Q node shielding layer QS, but the Q node shielding layer may be electrically floated.

In the display device 1100 according to still another exemplary aspect of the present disclosure, the Q node shielding layer QS is disposed between the substrate 110 and the Q node so that the parasitic capacitance between the substrate 110 and the Q node may be reduced or minimized. Specifically, the Q node shielding layer QS which may block the parasitic capacitance to be generated between the substrate 110 and the Q node is disposed and the Q node shielding layer QS may be disposed so as not to overlap with the portion VL having a different potential from that of the Q node. Further, the Q node shielding layer QS is electrically floated to block the parasitic capacitance between the Q node and the substrate 110. Accordingly, in the display device according to another exemplary aspect of the present disclosure, the Q node shielding layer QS which is electrically floated is disposed between the substrate 110 and the Q node to reduced or minimize the parasitic capacitance between the substrate 110 and the Q node. Further, the bootstrap of the Q node is normally implemented to suppress signal delay or driving failure which may be caused in the gate driver GD to improve the reliability of the display device 1100.

Figure 12A:
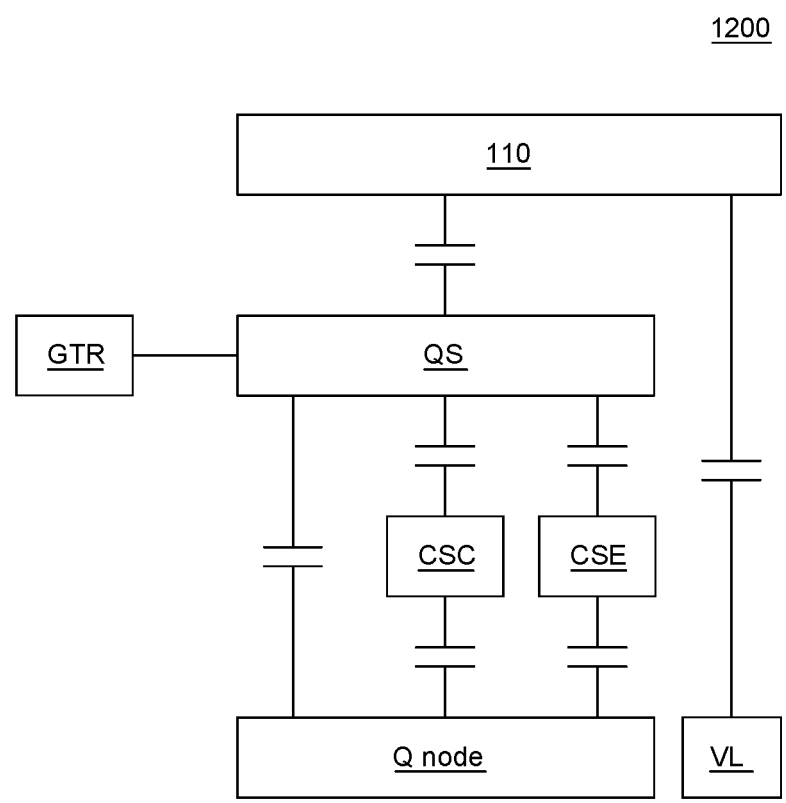
FIG. 12A is a schematic diagram of a gate driver of a display device according to still another exemplary aspect of the present disclosure.
Figure 12B:
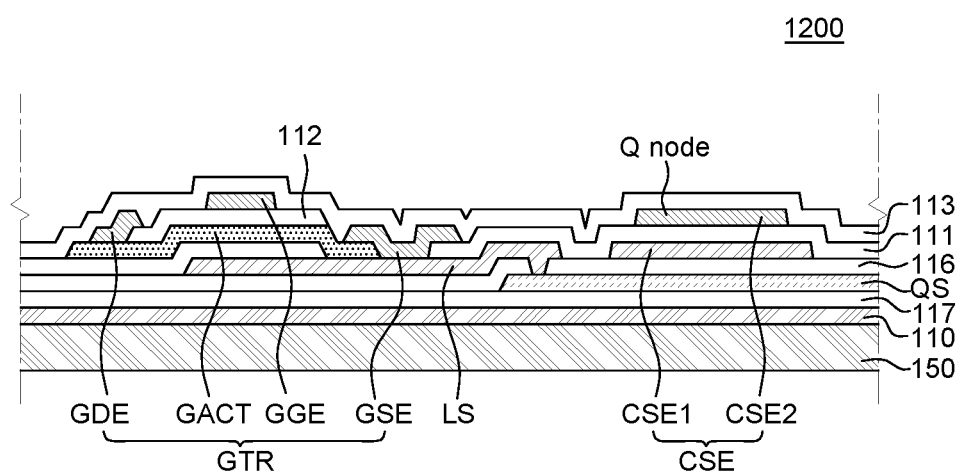
FIG. 12B is a schematic cross-sectional view of a gate driver of a display device according to still another exemplary aspect of the present disclosure.

FIG. 12A is a schematic diagram of a gate driver of a display device according to still another exemplary aspect of the present disclosure. FIG. 12B is a schematic cross-sectional view of a gate driver of a display device according to still another exemplary aspect of the present disclosure. In FIG. 12A, for the convenience of description, among various configurations of the display device 1200, only a substrate 110, a Q node, a Q node shielding layer QS, a plurality of capacitors CSC and CSE, a transistor GTR of a gate driver GD, and a portion VL which has a potential different from the Q node are schematically illustrated. Further, in FIG. 12B, for the convenience of description, among various components of the display device 1200, only a polarizer 150, a substrate 110, an additional buffer layer 117, a Q node shielding layer QS, a lower buffer layer 116, a light shielding layer LS, a transistor GTR of a gate driver, an upper buffer layer 111, a gate insulating layer 112, a passivation layer 113, a Q node, and a sense boot capacitor CSE are illustrated. As compared with the display device 100 of FIGS. 1 to 8B, a display device 1200 of FIGS. 12A and 12B includes other configurations which are substantially the same, except that the Q node shielding layer QS is electrically connected to the transistor GTR of the gate driver GD, so that a redundant description will be omitted or be briefly provided.

Referring to FIGS. 12A and 12B, in the display device 1200 according to still another exemplary aspect of the present disclosure, the gate driver GD includes a transistor GTR and a light shielding layer LS. At this time, the transistor GTR of the gate driver GD may be any one of various transistors GTR included in the gate driver GD.

Referring to FIG. 12B, the transistor GTR of the gate driver GD includes an active layer GACT, a gate electrode GGE, a source electrode GSE, and a drain electrode GDE and a light shielding layer LS overlapping with the active layer GACT is disposed below the transistor GTR of the gate driver GD.

Referring to FIGS. 12A and 12B, in the display device 1200 according to still another exemplary aspect of the present disclosure, the Q node shielding layer QS is electrically connected to the transistor GTR of the gate driver GD.

Referring to FIG. 12B, the connection of the Q node shielding layer QS and the transistor GTR of the gate driver GD may be specifically performed by electrically connecting the source electrode GSE of the transistor GTR of the gate driver GD to the light shielding layer LS and electrically connecting the light shielding layer LS to the Q node shielding layer QS. The source electrode GSE of the transistor GTR of the gate driver GD may be electrically connected to the light shielding layer LS through a contact hole formed in the upper buffer layer 111 and the light shielding layer LS may be electrically connected to the Q node shielding layer QS through a contact hole formed in the lower buffer layer 116.

In the display device 1200 according to still another exemplary aspect of the present disclosure, the Q node shielding layer QS is electrically connected to the transistor GTR of the gate driver GD so that the parasitic capacitance between the Q node and the substrate 110 may be minimized.

Specifically, the Q node shielding layer QS is disposed between the substrate 110 and the Q node. Further, the Q node shielding layer QS is electrically connected to the source electrode GSE of the transistor GTR of the gate driver and a constant voltage is applied to the source electrode GSE so that a constant voltage may also be applied to the Q node shielding layer QS which is electrically connected to the source electrode GSE. Therefore, even though the parasitic capacitance is generated between the substrate 110 and the Q node, the parasitic capacitance between the substrate 110 and the Q node may be blocked by the Q node shielding layer QS to which the constant voltage is applied between the substrate 110 and the Q node. Accordingly, in the display device 1200 according to still another exemplary aspect of the present disclosure, the Q node shielding layer QS is electrically connected to the transistor GTR of the gate driver GD so that the parasitic capacitance between the Q node and the substrate 110 may be reduced or minimized. Further, the bootstrap of the Q node is normally implemented to suppress the signal delay or the driving failure which may be generated in the gate driver GD to improve the reliability of the display device 1200.

Hereinafter, effects of various exemplary aspects of the present disclosure will be described with reference to FIGS. 13A, FIG. 13B, and FIGS. 14A to 14G.

Figure 13A:
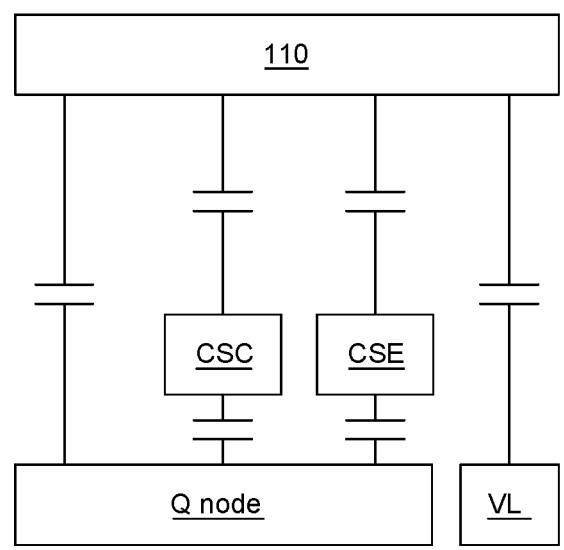
FIG. 13A is a schematic diagram of a first comparative example.
Figure 13B:
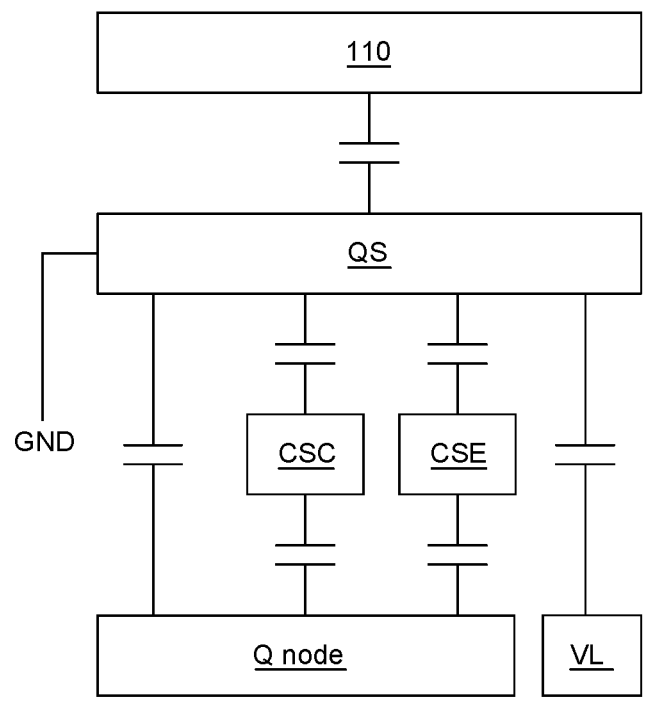
FIG. 13B is a schematic diagram of a second comparative example.
Figure 14A:
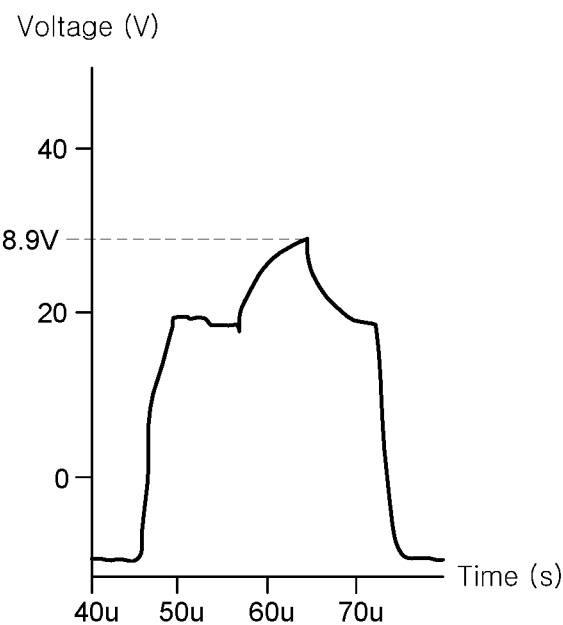
FIG. 14A is a graph obtained by measuring a voltage of a Q node of the first comparative example.
Figure 14B:
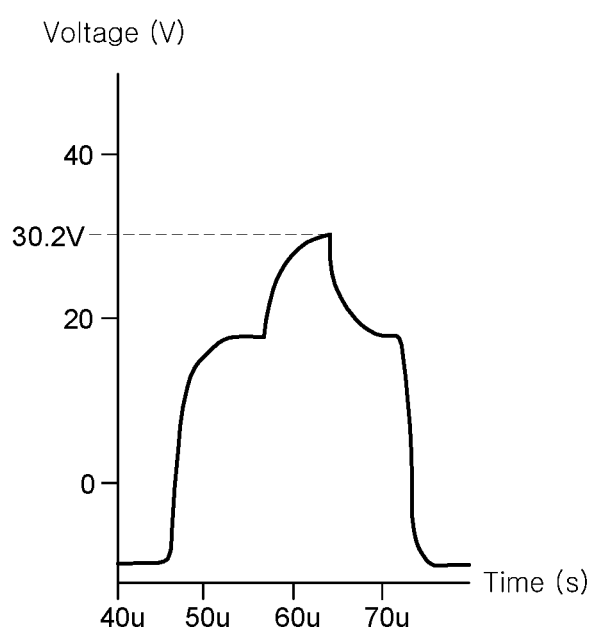
FIG. 14B is a graph obtained by measuring a voltage of a Q node of the second comparative example.
Figure 14C:
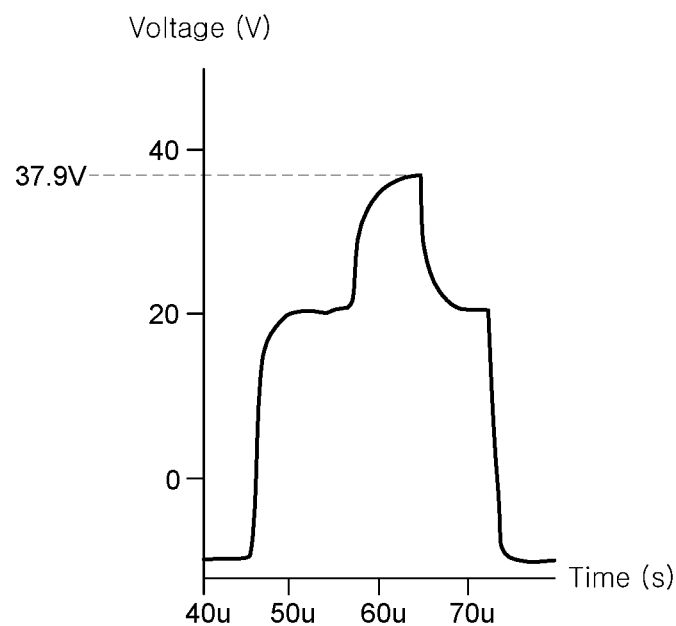
FIG. 14C is a graph obtained by measuring a voltage of a Q node of a display device according to an exemplary aspect of the present disclosure.
Figure 14D:
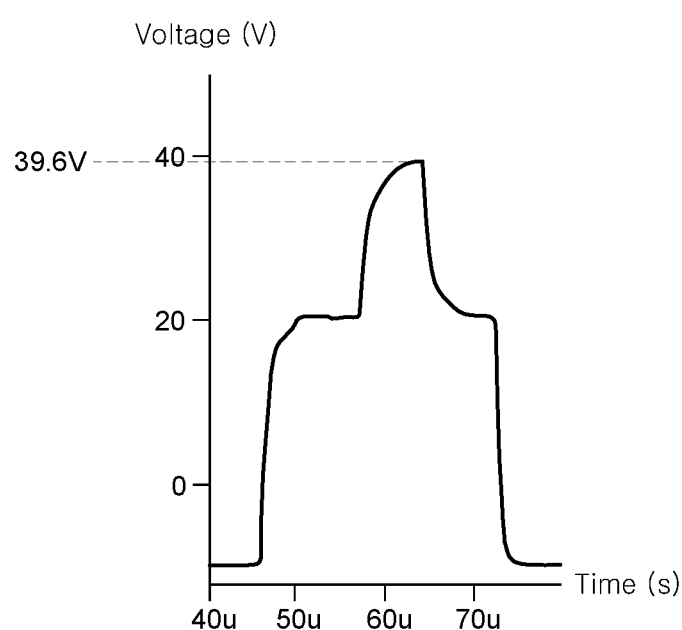
FIG. 14D is a graph obtained by measuring a voltage of a Q node of a display device according to another exemplary aspect of the present disclosure.
Figure 14E:
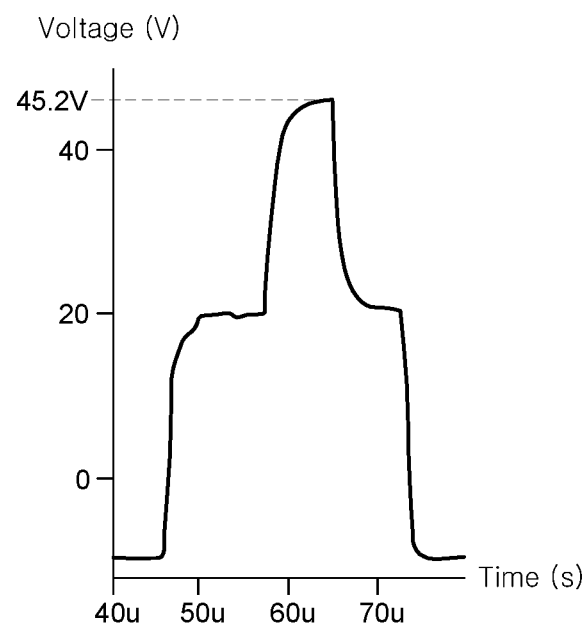
FIG. 14E is a graph obtained by measuring a voltage of a Q node of a display device according to still another exemplary aspect of the present disclosure.
Figure 14F:
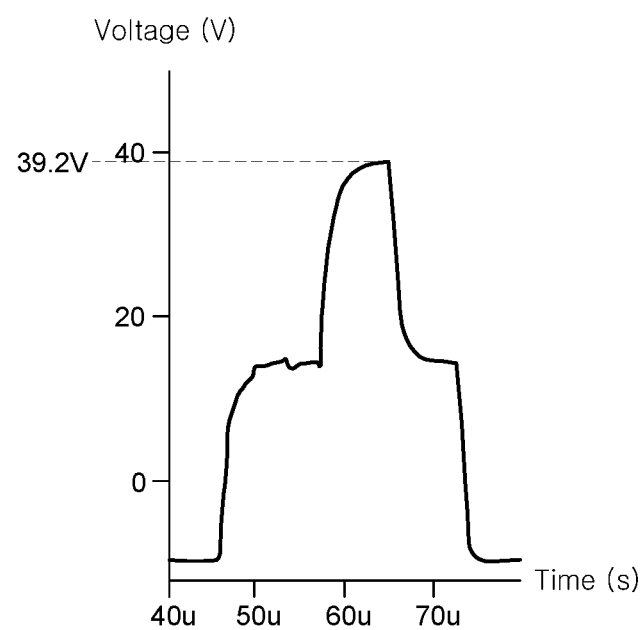
FIG. 14F is a graph obtained by measuring a voltage of a Q node of a display device according to still another exemplary aspect of the present disclosure.
Figure 14G:
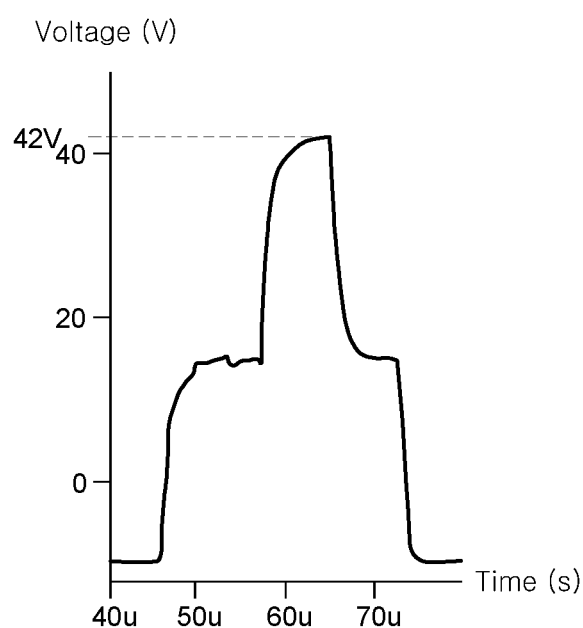
FIG. 14G is a graph obtained by measuring a voltage of a Q node of a display device according to still another exemplary aspect of the present disclosure.

FIG. 13A is a schematic diagram of a first comparative example. FIG. 13B is a schematic diagram of a second comparative example. FIG. 14A is a graph obtained by measuring a voltage of a Q node of the first comparative example. FIG. 14B is a graph obtained by measuring a voltage of a Q node of the second comparative example. FIG. 14C is a graph obtained by measuring a voltage of a Q node of a display device according to an exemplary aspect of the present disclosure. FIG. 14D is a graph obtained by measuring a voltage of a Q node of a display device according to another exemplary aspect of the present disclosure. FIG. 14E is a graph obtained by measuring a voltage of a Q node of a display device according to still another exemplary aspect of the present disclosure. FIG. 14F is a graph obtained by measuring a voltage of a Q node of a display device according to still another exemplary aspect of the present disclosure. FIG. 14G is a graph obtained by measuring a voltage of a Q node of a display device according to still another exemplary aspect of the present disclosure. The first comparative example illustrated in FIG. 13A is a comparative example in which the Q node shielding layer QS applied to the display devices 100, 900, 1000, 1100, and 1200 according to various exemplary aspects of the present disclosure is not applied. The second comparative example illustrated in FIG. 13B is a comparative example in which a ground voltage GND is applied to the Q node shielding layer QS, and simultaneously, the Q node shielding layer QS overlaps with not only the Q node, but also a portion VL having a potential different from that of the Q node. FIGS. 14A to 14G are graphs obtained by measuring a voltage during the charging and the bootstrap operation of the Q node in the first comparative example, the second comparative example, the display device 100 illustrated in FIGS. 1 to 8B, the display device 900 illustrated in FIGS. 9A and 9B, the display device 1000 illustrated in FIGS. 10A and 10B, the display device 1100 illustrated in FIGS. 11A and 11B, and the display device 1200 illustrated in FIGS. 12A and 12B, respectively.

Generally, the Q node operates by two steps of charging and bootstrap. Here, the charging may also be referred to as pre-charging. When the Q node is sufficiently charged, the voltage of the Q node rises to approximately 20 V and when the Q node is sufficiently bootstrapped, the voltage of the Q node may rise to approximately 35 V to approximately 45 V.

First, referring to FIG. 14A, in the first comparative example in which a separate Q node shielding layer QS is not used, the Q node may be charged, but as a bootstrap result of the Q node, the voltage of the Q node is measured as approximately 28.9 V so that the Q node is not sufficiently bootstrapped. This is caused by the parasitic capacitance generated between the substrate 110 and the Q node because the transparent conducting oxide layer and the oxide semiconductor layer are used for the substrate 110 of the display device.

Next, referring to FIG. 14B, even though the Q node shielding layer QS is used and a ground voltage GND is applied to the Q node shielding layer QS, in the second comparative example in which the Q node shielding layer QS overlap with not only the Q node, but also a portion VL having a potential different from that of the Q node, the Q node is charged. However, as a bootstrap result of the Q node, the voltage of the Q node is measured as approximately 30.2 V so that the Q node is not sufficiently bootstrapped.

Next, referring to FIG. 14C, in the display device 100 according to the exemplary aspect of the present disclosure, the Q node shielding layer QS is disposed to overlap with only the Q node of the gate driver GD and a Q node line which is directly connected to the Q node and has the same potential as the Q node. Accordingly, in the display device 100 according to the exemplary aspect of the present disclosure, a voltage of the Q node during the boosting operation is measured as approximately 37.9 V so that a normal operation may be possible. Therefore, in the display device 100 according to the exemplary aspect of the present disclosure, a potential of the Q node may be stably maintained.

Further, referring to FIG. 14D, the display device 900 according to another exemplary aspect of the present disclosure, the Q node shielding layer QS is disposed to be electrically floated. Accordingly, in the display device 900 according to another exemplary aspect of the present disclosure, a voltage of the Q node during the bootstrap operation is measured as approximately 39.6 V so that a normal operation may be possible. Therefore, in the display device 900 according to another exemplary aspect of the present disclosure, a potential of the Q node may be stably maintained.

Referring to FIG. 14E, in the display device 1000 according to still another exemplary aspect of the present disclosure, the Q node shielding layer QS and one electrode of the scan boot capacitor CSC or the sense boot capacitor CSE are disposed to be electrically connected. Accordingly, in the display device 1000 according to still another exemplary aspect of the present disclosure, a voltage of the Q node during the bootstrap operation is measured as approximately 45.2 V so that a normal operation may be possible. Therefore, in the display device 1000 according to still another exemplary aspect of the present disclosure, a potential of the Q node may be stably maintained.

Next, referring to FIG. 14F, the display device 1100 according to still another exemplary aspect of the present disclosure is configured such that only the upper buffer layer 111 is disposed between the Q node shielding layer QS and two electrodes of the scan boot capacitor CSC or the sense boot capacitor CSE and the gate insulating layer 112 is not disposed. Accordingly, in the display device 1100 according to still another exemplary aspect of the present disclosure, a voltage of the Q node during the bootstrap operation is measured as approximately 39.2 V so that a normal operation may be possible. Therefore, in the display device 1100 according to still another exemplary aspect of the present disclosure, a potential of the Q node may be stably maintained.

Finally, referring to FIG. 14G, in the display device 1200 according to still another exemplary aspect of the present disclosure, the Q node shielding layer QS is electrically connected to the transistor GTR of the gate driver GD. Accordingly, in the display device 1200 according to still another exemplary aspect of the present disclosure, a voltage of the Q node during the bootstrap operation is measured as approximately 42 V so that a normal operation may be possible. Therefore, in the display device 1200 according to still another exemplary aspect of the present disclosure, a potential of the Q node may be stably maintained.

The exemplary aspects of the present disclosure may also be described as follows:

According to an aspect of the present disclosure, a display device includes a substrate which includes an active area and a non-active area and is formed of any one of transparent conducting oxide and an oxide semiconductor layer; a gate driver which is disposed in the non-active area on the substrate and includes a Q node; and a Q node shielding layer disposed between the substrate and the Q node.

The Q node shielding layer may overlap with the Q node of the gate driver and a Q node line which is directly connected to the Q node to have the same potential as the Q node.

The Q node shielding layer may do not overlap with a portion of the gate driver which has a potential different from that of the Q node.

The Q node shielding layer may be electrically floated.

The Q node shielding layer may be applied with a ground voltage.

The gate driver may further include a capacitor connected to the Q node and the Q node shielding layer is electrically connected to one electrode of the capacitor.

The display device may further comprise an insulating layer disposed between the Q node shielding layer and one electrode of the capacitor.

The Q node shielding layer and one electrode of the capacitor may be electrically connected through a contact hole of the insulating layer.

The capacitor may be connected to an output unit of the gate driver.

The capacitor may be provided in plural and the Q node shielding layer may be electrically connected to one electrode of one capacitor among the plurality of capacitors.

The gate driver may further include a transistor including an active layer, a gate electrode, a drain electrode, and a source electrode; a gate insulating layer disposed between the active layer and the gate electrode; and a plurality of capacitors which is electrically connected to the Q node and includes a first electrode disposed above the Q node shielding layer and a second electrode disposed above the first electrode.

The gate insulating layer may be not disposed in an area in which the first electrode and the second electrode overlap with each other, between the first electrode and the second electrode.

The Q node shielding layer may be electrically floated.

The gate driver may further include a transistor including an active layer, a gate electrode, a drain electrode, and a source electrode.

The Q node shielding layer may be electrically connected to the transistor.

The gate driver may further include a light shielding layer which is disposed to overlap with the active layer below the transistor.

The source electrode may be electrically connected to the light shielding layer and the light shielding layer may be electrically connected to the Q node shielding layer.

According to another aspect of the present disclosure, a display device includes a substrate which includes an active area including a plurality of sub pixels disposed therein and a non-active area and is formed of any one of transparent conducting oxide and an oxide semiconductor layer; a gate driver which is disposed in the non-active area on the substrate to be connected to the plurality of sub pixels and includes a Q node; and a Q node shielding layer disposed to overlap with the Q node between the substrate and the Q node.

The Q node shielding layer may overlap with only the Q node of the gate driver and a Q node line which is directly connected to the Q node to have the same potential as the Q node, but may do not overlap with a portion of the gate driver which has a potential different from that of the Q node.

The Q node shielding layer may be electrically floated.

The Q node shielding layer may be applied with a ground voltage.

The gate driver may further include a capacitor connected to the Q node.

The Q node shielding layer may be electrically connected to one electrode of the capacitor.

The display device may further comprise an insulating layer disposed between the Q node shielding layer and one electrode of the capacitor.

The Q node shielding layer and one electrode of the capacitor may be electrically connected through a contact hole of the insulating layer.

The gate driver may further include a transistor including an active layer, a gate electrode, a drain electrode, and a source electrode; a gate insulating layer disposed between the active layer and the gate electrode; and a plurality of capacitors which is electrically connected to the Q node and includes a first electrode disposed above the Q node shielding layer and a second electrode disposed above the first electrode.

The gate insulating layer may be not disposed in an area in which the first electrode and the second electrode overlap with each other, between the first electrode and the second electrode.

The gate driver may further include a transistor including an active layer, a gate electrode, a drain electrode, and a source electrode.

The Q node shielding layer and the transistor may be electrically connected to each other.

The gate driver may further include a light shielding layer which is disposed below the transistor and overlaps with the active layer.

The source electrode of the transistor may be electrically connected to the light shielding layer and the light shielding layer may be electrically connected to the Q node shielding layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate including an active area and a non-active area and formed of one of transparent conducting oxide and an oxide semiconductor layer;
    a gate driver disposed in the non-active area on the substrate and including a Q node; and
    a Q node shielding layer disposed between the substrate and the Q node,
    wherein the gate driver further includes a capacitor connected to the Q node, and
    the Q node shielding layer is electrically connected to one electrode of the capacitor.

2. The display device according to claim 1, wherein the Q node shielding layer overlaps with the Q node of the gate driver and a Q node line which is directly connected to the Q node to have the same potential as the Q node.

3. The display device according to claim 2, wherein the Q node shielding layer does not overlap with a portion of the gate driver which has a potential different from that of the Q node.

4. The display device according to claim 1, further comprising an insulating layer disposed between the Q node shielding layer and one electrode of the capacitor,
    wherein the Q node shielding layer and one electrode of the capacitor are electrically connected through a contact hole of the insulating layer.

5. The display device according to claim 1, wherein the capacitor is connected to an output unit of the gate driver.

6. The display device according to claim 1, wherein the capacitor is provided in plural and the Q node shielding layer is electrically connected to one electrode of one capacitor among a plurality of capacitors.

7. A display device, comprising:
a substrate including an active area and a non-active area and formed of one of transparent conducting oxide and an oxide semiconductor layer;
a gate driver disposed in the non-active area on the substrate and including a Q node; and
a Q node shielding layer disposed between the substrate and the Q node,
wherein the gate driver further includes:
a transistor including an active layer, a gate electrode, a drain electrode, and a source electrode;
a gate insulating layer disposed between the active layer and the gate electrode; and
a plurality of capacitors which is electrically connected to the Q node and includes a first electrode disposed above the Q node shielding layer and a second electrode disposed above the first electrode, and
wherein the gate insulating layer is not disposed in an area in which the first electrode and the second electrode overlap with each other, between the first electrode and the second electrode.

8. The display device according to claim 7, wherein the Q node shielding layer is electrically floated.

9. A display device, comprising:
a substrate including an active area and a non-active area and formed of one of transparent conducting oxide and an oxide semiconductor layer;
a gate driver disposed in the non-active area on the substrate and including a Q node; and
a Q node shielding layer disposed between the substrate and the Q node
wherein the gate driver further includes a transistor including an active layer, a gate electrode, a drain electrode, and a source electrode, and
wherein the Q node shielding layer is electrically connected to the source electrode of the transistor and is applied with a constant voltage.

10. The display device according to claim 9, wherein the gate driver further includes a light shielding layer which is disposed so as to overlap with the active layer below the transistor and
wherein the source electrode is electrically connected to the light shielding layer and the light shielding layer is electrically connected to the Q node shielding layer.

* * * * *